(12) United States Patent
Choquet et al.

(10) Patent No.: US 8,891,171 B2
(45) Date of Patent: Nov. 18, 2014

(54) HIGH SAG THICK LENS FOR USE IN AN ILLUMINATION APPARATUS

(71) Applicant: DBM Reflex Enterprises Inc., Laval (CA)

(72) Inventors: Eric Choquet, Blainville (CA); George Iatan, St. Lambert (CA)

(73) Assignee: DBM Reflex Enterprises Inc., Laval, Quebec (CA)

( * ) Notice: Subject to any disclaimer, the term of this patent is extended or adjusted under 35 U.S.C. 154(b) by 101 days.

(21) Appl. No.: 13/763,454

(22) Filed: Feb. 8, 2013

(65) Prior Publication Data

US 2013/0148363 A1 Jun. 13, 2013

Related U.S. Application Data

(63) Continuation-in-part of application No. 13/172,093, filed on Jun. 29, 2011, which is a continuation-in-part of application No. PCT/CA2011/000129, filed on Feb. 1, 2011.

(60) Provisional application No. 61/300,201, filed on Feb. 1, 2010.

(51) Int. Cl.
| | |
|---|---|
| *F21V 5/04* | (2006.01) |
| *B29C 45/16* | (2006.01) |
| *B29D 11/00* | (2006.01) |
| *B60Q 1/04* | (2006.01) |
| *B29L 11/00* | (2006.01) |
| *H01L 33/58* | (2010.01) |

(52) U.S. Cl.
CPC . *F21V 5/04* (2013.01); *B29C 45/16* (2013.01); *B29L 2011/0016* (2013.01); *B29D 11/00432* (2013.01); *B60Q 1/04* (2013.01); *H01L 33/58* (2013.01)
USPC .......... 359/642; 362/215; 362/335; 264/478; 264/645

(58) Field of Classification Search
CPC .............. F21V 5/04; B29L 2011/0016; B29D 11/00432; B60Q 1/04; H01L 33/58; B29C 45/16

USPC .......... 362/215, 326, 335; 264/1.1, 1.32, 1.7, 264/478, 645; 359/642, 708
See application file for complete search history.

(56) References Cited

U.S. PATENT DOCUMENTS 2,623,159 A * 12/1952 Komasa .................. 362/331
3,466,700 A 9/1969 Harrison
(Continued)

FOREIGN PATENT DOCUMENTS

| CA | 2691219 A1 | 12/2008 |
|---|---|---|
| DE | 298620 A5 | 3/1992 |

(Continued)

OTHER PUBLICATIONS

Clockdoc, "Polarization and Stress Analysis", 2007, http://web.archive.org/web/20100805051934/http://digital-photography-school.com/forum/how-i-took/3793-polarization-stress-analysis.html.

(Continued)

*Primary Examiner* — Thomas K Pham
*Assistant Examiner* — Collin X Beatty
(74) *Attorney, Agent, or Firm* — Ipaxio S.E.N.C.

(57) ABSTRACT

The high sag thick lens is for use in an illumination apparatus, such as a solid state light source. The lens is made of a first lens part having an optical active surface and a series of elongated baffles, the baffles having a top portion, the top portions defining a line that follows the curvature of the optical active surface to create a second lens part of uniform thickness. A second lens part is fused to the first lens part to create the lens. The second lens part has an optical active surface and a series of elongated baffles, the baffles having a thickness comparable to the thickness of the corresponding optical active surfaces. The first and the second baffles are intertwined along the entire length of their lateral surfaces.

9 Claims, 23 Drawing Sheets

(56) References Cited

U.S. PATENT DOCUMENTS

| | | | |
|---|---|---|---|
| 3,708,221 A * | 1/1973 | Schaefer | 359/718 |
| 4,417,790 A * | 11/1983 | Dawson et al. | 351/159.57 |
| 4,935,184 A | 6/1990 | Sorensen | |
| 5,045,268 A | 9/1991 | Sorensen | |
| 5,618,474 A * | 4/1997 | Liau et al. | 264/1.1 |
| 5,922,250 A | 7/1999 | Ishikawa et al. | |
| 6,290,882 B1 | 9/2001 | Maus et al. | |
| 6,416,690 B1 | 7/2002 | Soane et al. | |
| 6,491,851 B1 * | 12/2002 | Keller et al. | 264/1.32 |
| 6,744,563 B2 | 6/2004 | Suzuki | |
| 6,838,031 B2 | 1/2005 | Kozlovski | |
| 7,048,378 B2 | 5/2006 | Chen | |
| 7,060,175 B2 * | 6/2006 | Morikawa et al. | 205/79 |
| 7,261,448 B2 | 8/2007 | Ishida et al. | |
| 7,267,791 B2 * | 9/2007 | Ricking et al. | 264/255 |
| 7,290,906 B2 | 11/2007 | Suzuki et al. | |
| 7,401,963 B2 | 7/2008 | Stefanov et al. | |
| 7,488,084 B2 * | 2/2009 | Potucek et al. | 362/101 |
| 7,682,533 B2 | 3/2010 | Iatan | |
| 7,722,196 B2 | 5/2010 | Caire et al. | |
| 7,742,383 B2 | 6/2010 | Ito | |
| 7,859,772 B2 * | 12/2010 | Takagi et al. | 359/796 |
| 7,864,427 B2 * | 1/2011 | Korenaga et al. | 359/576 |
| 7,965,445 B2 | 6/2011 | Chen et al. | |
| 8,252,369 B2 | 8/2012 | Jiang | |
| 2002/0018177 A1 * | 2/2002 | Dillon | 351/163 |
| 2002/0034081 A1 | 3/2002 | Serizawa | |
| 2005/0213209 A1 * | 9/2005 | Miyakoshi et al. | 359/486 |
| 2006/0072208 A1 | 4/2006 | Bonitz et al. | |
| 2006/0273478 A1 * | 12/2006 | Jin et al. | 264/1.32 |
| 2007/0002446 A1 * | 1/2007 | Takeuchi et al. | 359/569 |
| 2007/0002467 A1 * | 1/2007 | Claytor | 359/743 |
| 2007/0091443 A1 | 4/2007 | Lim et al. | |
| 2008/0030675 A1 * | 2/2008 | Dillon | 351/159 |
| 2008/0111260 A1 * | 5/2008 | Harchanko et al. | 264/1.36 |
| 2008/0299340 A1 | 12/2008 | Kamienski et al. | |
| 2008/0310159 A1 * | 12/2008 | Chinniah et al. | 362/244 |
| 2009/0180185 A1 * | 7/2009 | Hayashi | 359/566 |
| 2009/0225215 A1 * | 9/2009 | Korenaga et al. | 348/340 |
| 2010/0091511 A1 | 4/2010 | Erward et al. | |
| 2010/0118531 A1 * | 5/2010 | Montagne | 362/235 |
| 2010/0128488 A1 * | 5/2010 | Marcoux | 362/311.02 |
| 2010/0134888 A1 * | 6/2010 | Korenaga et al. | 359/576 |
| 2010/0178614 A1 * | 7/2010 | Hwang et al. | 430/321 |
| 2010/0202154 A1 | 8/2010 | Hamkens | |
| 2010/0246008 A1 * | 9/2010 | Murata et al. | 359/576 |
| 2010/0284201 A1 * | 11/2010 | Alasaarela et al. | 362/551 |

FOREIGN PATENT DOCUMENTS

| | | |
|---|---|---|
| DE | 102007011338 A1 | 9/2008 |
| DE | 102007020418 A1 | 10/2008 |
| DE | 102008034153 A1 | 1/2010 |
| EP | 1785255 A1 | 5/2007 |
| EP | 1857246 A1 | 11/2007 |
| EP | 2402140 A1 | 1/2012 |
| JP | 2001-191365 A | 7/2001 |
| WO | 9423929 A1 | 10/1994 |
| WO | 2011061638 A1 | 5/2011 |
| WO | 2011083002 A1 | 7/2011 |
| WO | 2011091529 A1 | 8/2011 |
| WO | 2012069590 A1 | 5/2012 |
| WO | 2012093994 A2 | 7/2012 |
| WO | 2012111381 A1 | 8/2012 |
| WO | 2012125697 A2 | 9/2012 |

OTHER PUBLICATIONS

Office Action dated Feb. 13, 2014 in U.S. Appl. No. 13/172,093, filed Jun. 29, 2011.

Stricker et al., Kunststoffe International Apr. 2009, Document No. PE110084; „Focus on Precision—Injection Molding Optical Components (pp. 30-34).

Thienel et al., Kunststoffe International Jun. 2010, Document No. PE110412; „Playing with Light—Injection Compression Molding (pp. 22-28).

* cited by examiner

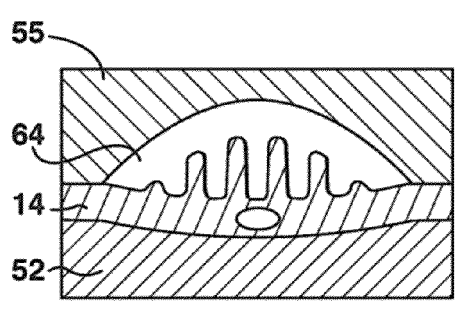
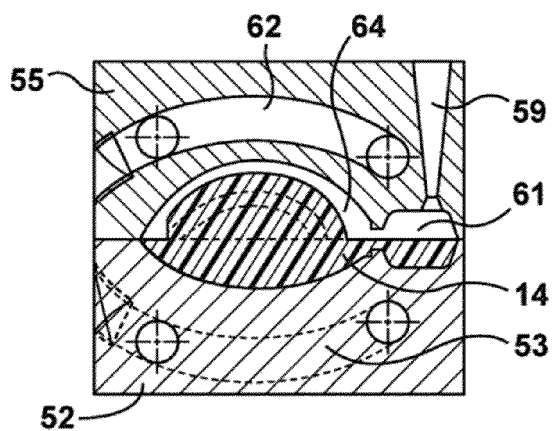
FIG. 15   FIG. 16
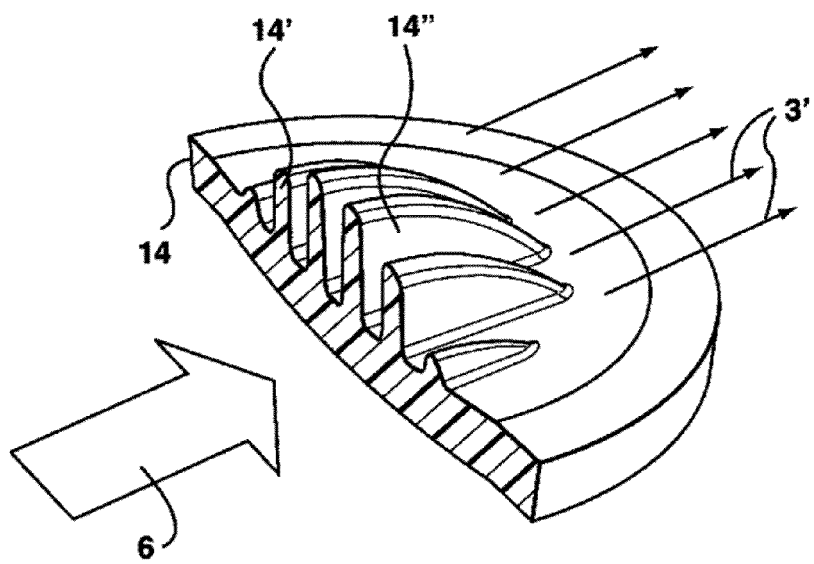
FIG. 17

HIGH SAG THICK LENS FOR USE IN AN ILLUMINATION APPARATUS

CROSS-REFERENCE RELATED APPLICATIONS

This application is a continuation-in-part of pending U.S. patent application Ser. No. 13/172,093 filed on 29 Jun. 2011, which is a continuation-in-part of PCT application No. PCT/CA2011/000129 filed on 1 Feb. 2011, now expired, which PCT application claims the benefit of 35 U.S.C. §119(e) of U.S. provisional patent application No. 61/300,201 filed on 1 Feb. 2010. The disclosures of these earlier applications are herein incorporated by reference.

TECHNICAL FIELD

The technical field relates to high sag thick lenses for use in illumination apparatuses, for instance illumination apparatuses having solid state light sources with which the high sag thick lenses are optically coupled. More particularly, it relates to high sag thick lenses made of a plastic material in a multistep process.

BACKGROUND

Illumination apparatuses for automotive vehicles often use powerful incandescent light sources that generate an intense heat. These light sources are generally optically coupled to optical glass lenses since glass can withstand the generated heat and will not deform in use. However, the heat from incandescent light sources is generally too high for optical lenses made of plastic materials.

Solid state light sources generate considerably less heat than incandescent light sources having the same illumination power. White LEDs are increasingly used as light sources in illumination apparatuses for the automotive industry, for example in head lights. Such illumination apparatuses can thus include optical lenses made of plastic materials because heat is not as high as with incandescent light sources.

Illumination apparatuses for automotive vehicles generally use high sag thick lenses to project the light in front of the vehicles. The light beam from the light sources is projected as a magnified image and the lens refracts the light rays accordingly. High sag thick lenses have a high ratio between the thickness of the lens along the central optical axis and the thickness of the lens at the edges. These optical lenses are thus relatively thicker compare to optical lenses in other applications, as defined by the standard understanding in the industry in terms of the ratio between the key dimensions of optical lenses.

High sag thick lenses made of plastic materials are not easy to manufacture using usual injection molding methods because the injection molding process itself may cause deformations of the optical active surfaces. These lenses tend to shrink during cooling in a manner that reduces their accuracy and performances. Ultimately, the quality of high sag thick lenses made of plastic materials can become an issue. Using the known injection methods thus create challenges in terms of costs and complexities. Other injection molding issues can have a negative impact on the quality of high sag thick lenses, particularly in terms of having a stable batch-to-batch consistency and surface accuracy.

Multistep injection methods for manufacturing plastic lenses have been used for several years. For instance, such method can include using rotary molds or shuttle molds to inject two or more layers of the same plastic material over one another with a clear boundary surface between each layer. However, several applications require stringent tolerances of the shape and the curvatures of optical lenses that can be difficult to obtain using these known methods.

Accordingly, there is still room for many improvements in this area of technology.

SUMMARY

One of the goals of the proposed concept is to improve the consistency of dimensional and functional tolerances of high sag thick lenses made of plastic materials using injection molding equipment. It is also a goal to provide an improved method that offers a competitive cycle time, a uniform cooling and an optimal flow of the molten plastic material during manufacturing.

In one aspect, there is provided a high sag thick lens for use with an illumination apparatus having a light source, the lens including: a first outer lens part having opposite first and second surfaces, the first surface of the first outer lens part defining a first curved optical active surface of the lens that refracts incoming light rays from the light source, the second surface of the first outer lens part including a plurality of first elongated baffles; a second outer lens part having opposite first and second surfaces, the first surface of the second outer lens part defining a second optical active surface of the lens that refracts the incoming light rays from the light source, the second surface of the second outer lens part including a plurality of second elongated baffles; and a lens core part forming an interior of the lens and that is embedded between the first outer lens part and the second outer lens part, the lens core part having opposite first and second surfaces, the first surface of the lens core part including a plurality of third elongated baffles and the second surface of the lens core part including a plurality of fourth elongated baffles; where the second surface of the first outer lens part and the first surface of the lens core part are fused together with the first elongated baffles being intertwined with the third elongated baffles, and where the second surface of the second outer lens part and the second surface of the lens core part are fused together with the second elongated baffles being intertwined with the fourth elongated baffles, and where the first outer lens part, the second outer lens part and the lens core part have a same refractive index and are made of a single solidified injection-moldable plastic material that entirely fills the interior of the lens in a gapless manner to prevent refraction of the incoming light rays from the light source by any one of the elongated baffles inside the lens.

In another aspect, there is provided a high sag thick lens made by injection molding in a mold through the injection of a single molten plastic material in at least three injection shots using a multi-step process, the lens including: a first optical active surface having a first outer edge and a second optical active surface having a second outer edge; a lens body defined between the first optical active surface and the second optical active surface for light rays to enter the lens through the first optical active surface and exit the lens through the second optical active surface, the lens body including a lens core part embedded inside the lens body between a first and a second outer lens part, the first optical active surface being provided on the first outer lens part that is injection molded after the lens core part and the second optical active surface being provided on the second outer lens part that is injection molded after the first outer lens part; a first mold gate mark located at the first outer edge and a second mold gate mark located at the second outer edge; a first internal flow pattern including at least two spaced apart and continuous streams of solidified plastic material that fully extend across the lens body, on one side of the lens core part, from the first mold gate; and a second internal flow pattern including at least two spaced apart and continuous streams that extend across the lens body, on another side of the lens core part, from the second mold gate, the first and second internal flow patterns being visible using optical testing devices.

In another aspect, there is provided an illumination apparatus including: a solid state light source; and a high sag thick lens through which light from the solid state light source is collected, the lens being constructed as previously defined.

In another aspect, there is provided a method of injection molding a high sag thick optical lens, the method including: providing a first mold cavity formed between a first mold insert and a mold core, the mold core having a core injection surface, the first mold insert having an injection surface and at least two spaced apart undercuts, each of the undercuts having at least two lateral walls, a depth, a width and a length; injecting a first amount of a molten plastic material into the first mold cavity through a first mold gate in such manner that the molten plastic material flows into the first mold cavity in a direction parallel to the lateral walls of the undercuts and along the length of the undercuts; cooling the plastic resin material in the first mold cavity, where the plastic material makes cooling contact with the undercuts so that at the end of the cooling time a first lens part is formed, the first lens part including at least two elongated baffles between the undercuts, where each elongated baffle includes two opposite lateral surfaces; providing a second mold cavity formed between the first lens part and a second mold insert; and injecting a second amount of the molten plastic material in the second mold cavity through a second mold gate that is positioned in alignment with the two lateral surfaces of the elongated baffles to allow the flow of the molten plastic material along two spaced-apart baffles.

Details on these aspects as well as other aspects of the proposed concept will be apparent from the following detailed description and the appended figures.

BRIEF DESCRIPTION OF THE FIGURES

FIGS. 12 to 20 illustrate examples of injection molding equipment to manufacture a high sag thick lens according to an embodiment of this invention;

DETAILED DESCRIPTION

Figure 1:
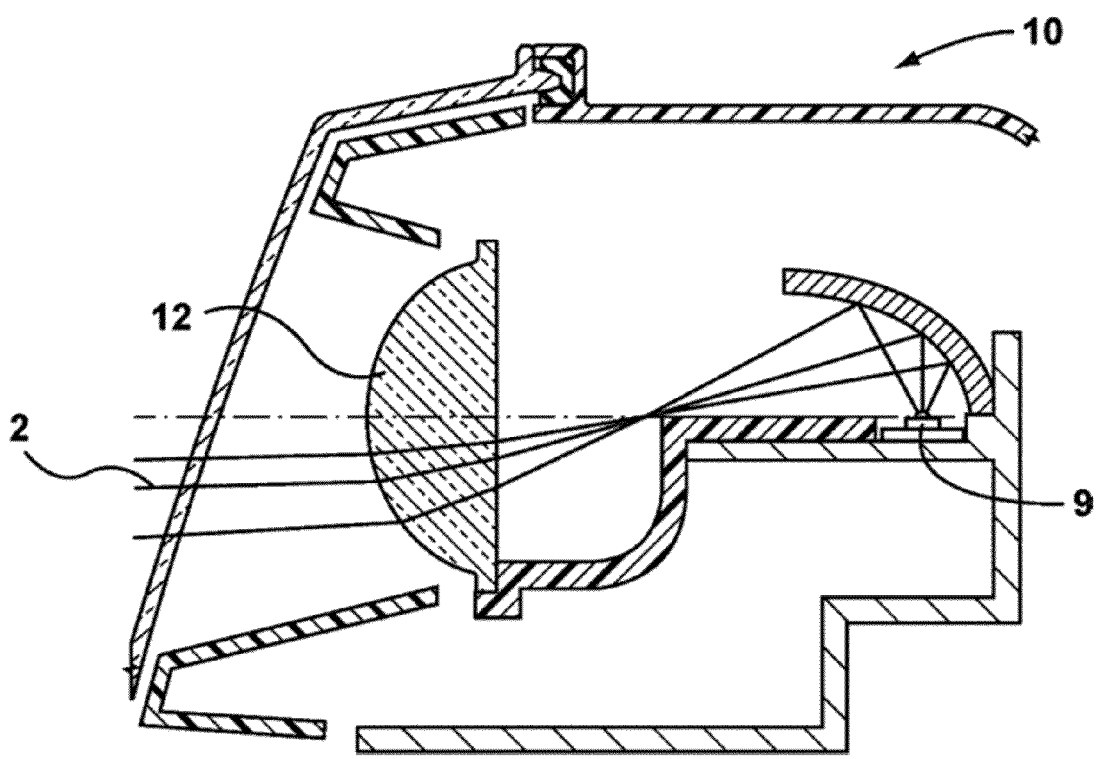
FIG. 1 is a cross-sectional view of an example of a high sag thick lens according to an embodiment of this invention, which lens is provided inside a generic example of an illumination apparatus.

FIG. 1 shows an example of a high sag thick lens 12 provided in an example of a head lamp 10, which head lamp 10 is a generic example of an illumination apparatus. The head lamp 10 includes a protective casing and a light source 9 with which the lens 12 is optically coupled. The light source 9 can be a solid state light source such a LED or more specifically, a white LED. Variants are also possible. In use, the light source 9 generates light rays 2 that are refracted by the lens 12.

Figure 2:
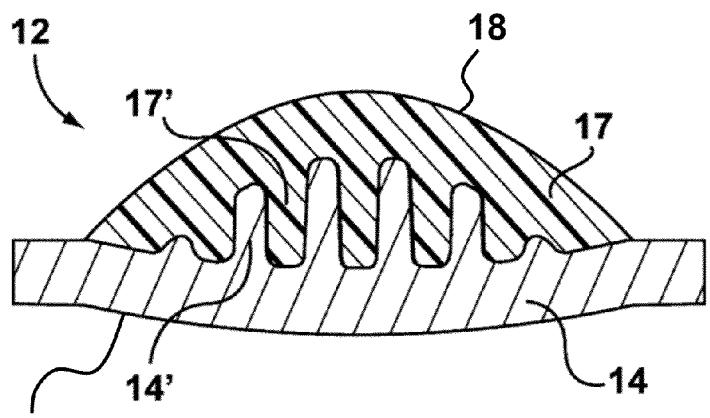
FIG. 2 is a cross-sectional view of the high sag thick lens of FIG. 1 where the two lens parts thereof are made visible for the sake of illustration.

FIG. 2 is a cross-sectional view of the high sag thick lens 12 of FIG. 1. This lens 12 is made of a transparent plastic resin material. Examples for plastic materials include Polymethylmethacrylate (PMMA), acrylic and polycarbonate, to name just a few. Other plastic materials can be used as well.

In FIG. 2, the illustrated lens 12 includes a first lens part 14 and a second lens part 17. The lens parts 13, 17 form the body of the lens 12. The two lens parts 14, 17 are separately visible only for the sake of illustration. The boundary between the lens parts 14, 17 is otherwise not distinguishable or visible with naked eye, for example using the light from the light source 9. There is thus no refraction of the light rays at the boundary between the lens parts 14, 17 inside the lens. However, the boundary is visible using polarized light, phase contrast microscopy or other known visualization devices or instruments. The two lens parts 14, 17 have the same refractive index. They are generally made of the same plastic material but variants are possible.

The lens 12 includes a first optical active surface 13 and a second optical active surface 18. At least one among the first optical active surface 13 and the second optical active surface 18 is curved, i.e. including at least a portion that is curved. This curved surface portion can be for instance spherical, cylindrical, aspheric, parabolic or free form.

The second lens part 17 is fused to the first lens part 14 during manufacturing to create the high sag thick lens 12. The term "fused" means securing or bonding the lens parts together using heat coming from the hot molten plastic material during the manufacturing process.

Each lens part 14, 17 has corresponding elongated baffles 14', 17'. The term "baffle" means a portion of a lens part. The baffles 14', 17' are used to facilitate and improve a multistep manufacturing process for making the high sag thick lens 12. These baffles 14', 17' have ends following the curvature of the optical active surface 18. When fused together to form the high sag thick lens 12, the baffles 14', 17' are intertwined or alternate in a cross section without any air gap between them and without affecting the illumination performance of the lens 12. The plastic material thus fills the entire volume of the lens 12.

Figure 3:
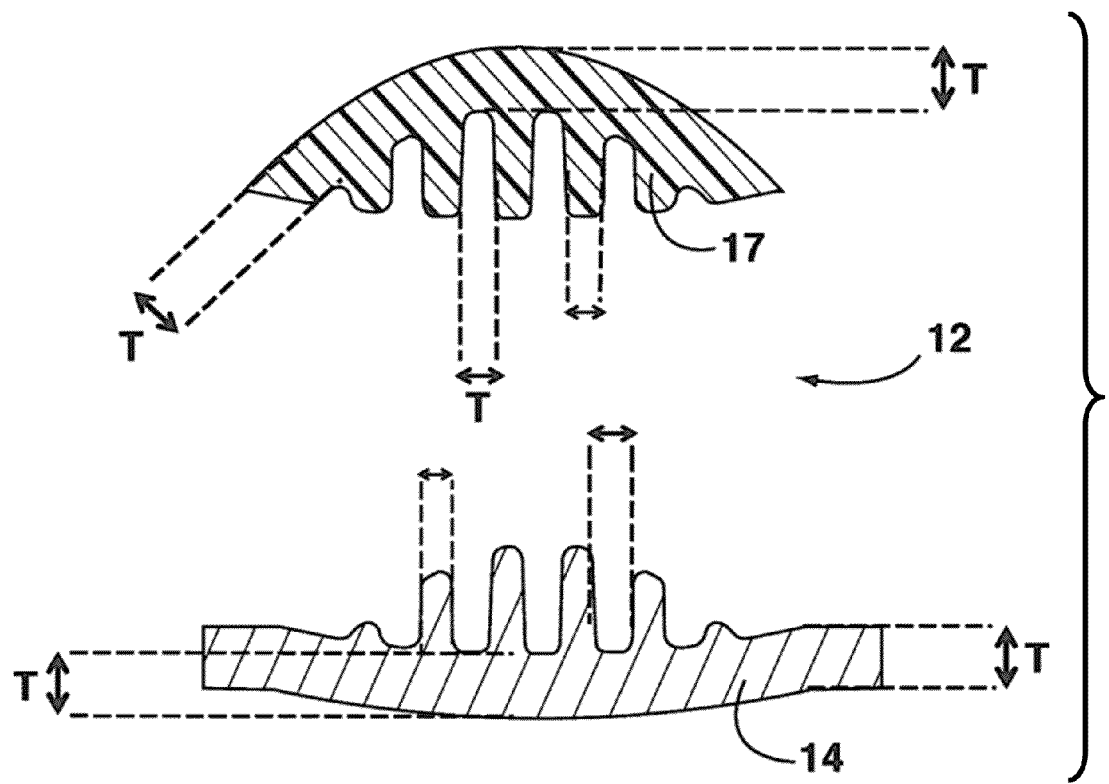
FIG. 3 is a cross-sectional view of the high sag thick lens of FIG. 1 where the two lens parts thereof are made visible and are shown as detached from one another for the sake of illustration.

FIG. 3 is a cross-sectional view of the high sag thick lens of FIG. 1 where the two lens parts 14, 17 are shown as detached from one another only for the sake of illustration. After the manufacturing process, the first lens part 14 and the second lens part 17 form a monolithic piece and they cannot be separated from one another.

As can be seen, the lens parts 14, 17 have equal or almost equal thicknesses defined as "T". The thickness (i.e. width) of the baffles 14' can also be the same or comparable from one another. Likewise, the thickness (i.e. width) of the baffles 17' can also be the same or comparable from one another. The thickness of the baffles 14', 17' is also the same or comparable to the thickness "T". These features will make the cooling more uniform during manufacturing. Nevertheless, variants are possible as well.

Figure 4:
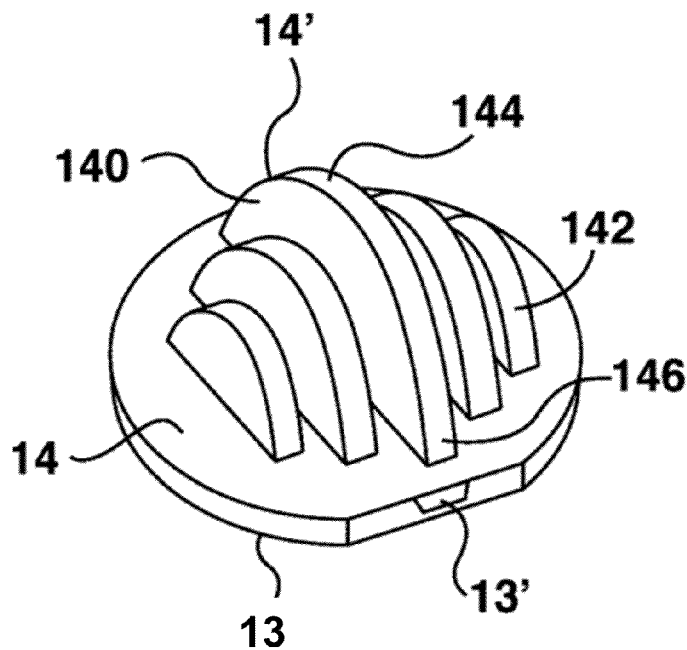
FIG. 4 is an isometric view of the first lens part of the high sag thick lens of FIG. 1.

FIG. 4 is an isometric view of the first lens part 14 of the high sag thick lens 12 of FIG. 1. As can be seen, the first elongated baffles 14' have two opposed lateral surfaces 140, the baffles 14' having an upper surface 142 and a top portion 144. The first lens part 14 includes a first mold gate 13'. The first mold gate 13' is indicative of the location where the molten plastic material was injected into the corresponding mold cavity during manufacturing.

Figure 5:
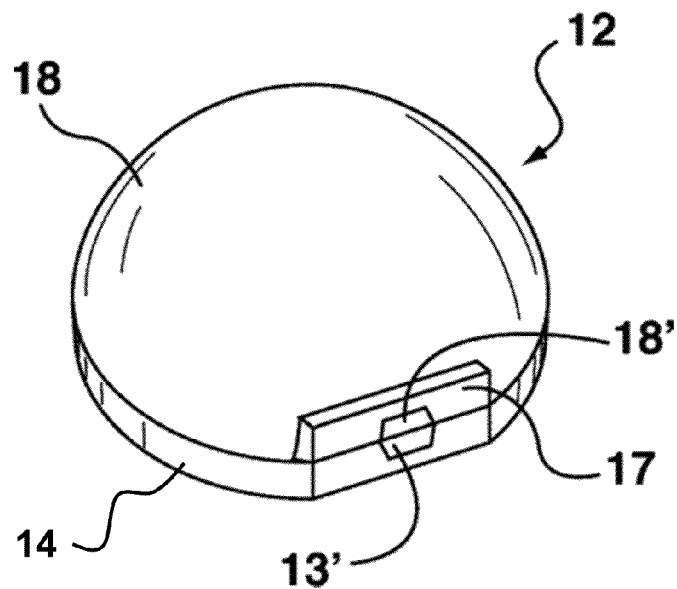
FIG. 5 is an isometric view of the high sag thick lens of FIG. 1 once the second lens part is added over the first lens part shown in FIG. 3.

FIG. 5 is an isometric view of the high sag thick lens 12 of FIG. 1 once the second lens part 17 is added over the first lens part 14 shown in FIG. 3. FIG. 5 also shows that the lens 12 includes a second mold gate 18'. The second mold gate 18' is indicative of the location where the molten plastic material was injected into the corresponding mold cavity during manufacturing. The baffles 14' of the first lens part 14 are parallel or almost parallel and they have elongated lateral surfaces 140 that define spacing portions 14" that are aligned with the second mold gate 18'. The first baffles 14' and the second baffles 17' are intertwined along the entire length of the lateral surfaces 140 of the first baffles 14' once the lens 12 is completed.

Figure 6:
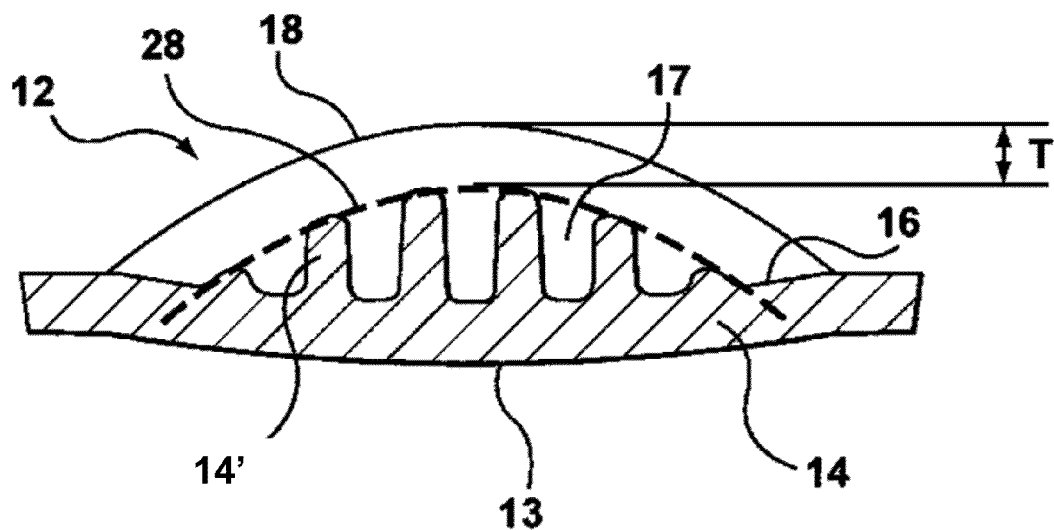
FIG. 6 is a view similar to FIG. 2 and illustrates another example of a high sag thick lens according to an embodiment of this invention.

FIG. 6 is a view similar to FIG. 2 and illustrates another example of a high sag thick lens 12 according to an embodiment of this invention. FIG. 6 shows that the tips of the baffles 14' define an imaginary curved line 28 that substantially follows the curvature of the second optical active surface 18.

Figure 7:
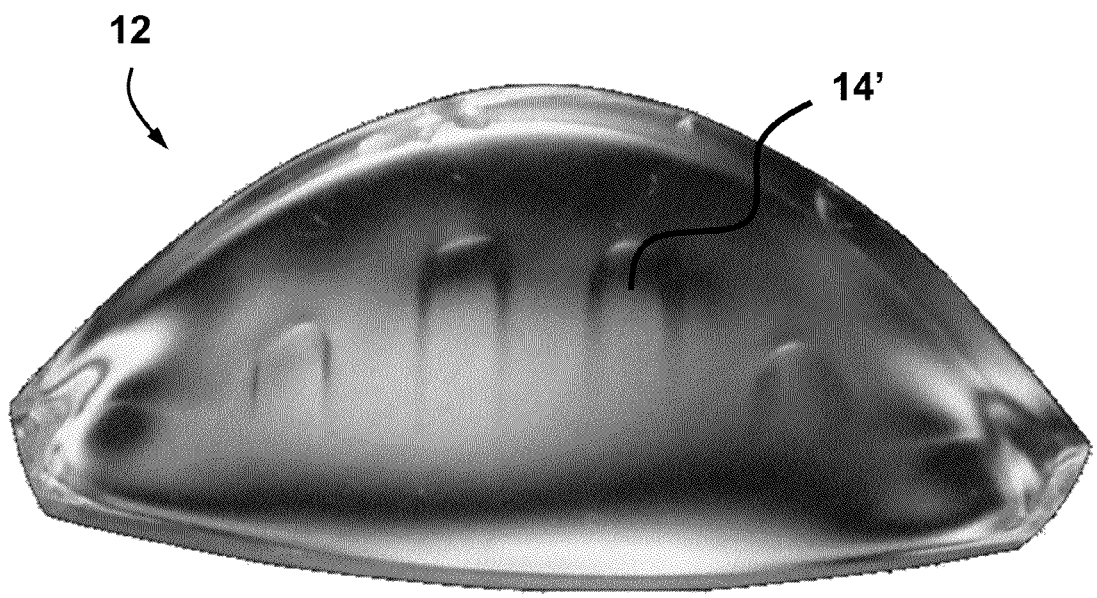
FIG. 7 is a photograph of an example of a high sag thick lens as seen under polarized light to reveal the presence of the internal baffles that are otherwise not visible using for instance the light from the light source.

FIG. 7 is a photograph of an example of a high sag thick lens 12 as seen under polarized light to reveal the presence of the internal baffles 14', 17'. The boundary between these baffles 14', 17' is otherwise not visible using for instance the light from the light source 9 in FIG. 1. Thus, the baffles 14', 17' cannot normally be seen and the lens 12 is totally transparent along the optical axis when viewed by an observer using the light from the light source 9.

The sag of a spherical lens defines the curvature or the depth of the lens as a function of the lens radius and the lens thickness along the optical axis. The lens thickness decreases from the center towards the edge of the lens in the case of a high sag thick lens.

Figure 8:
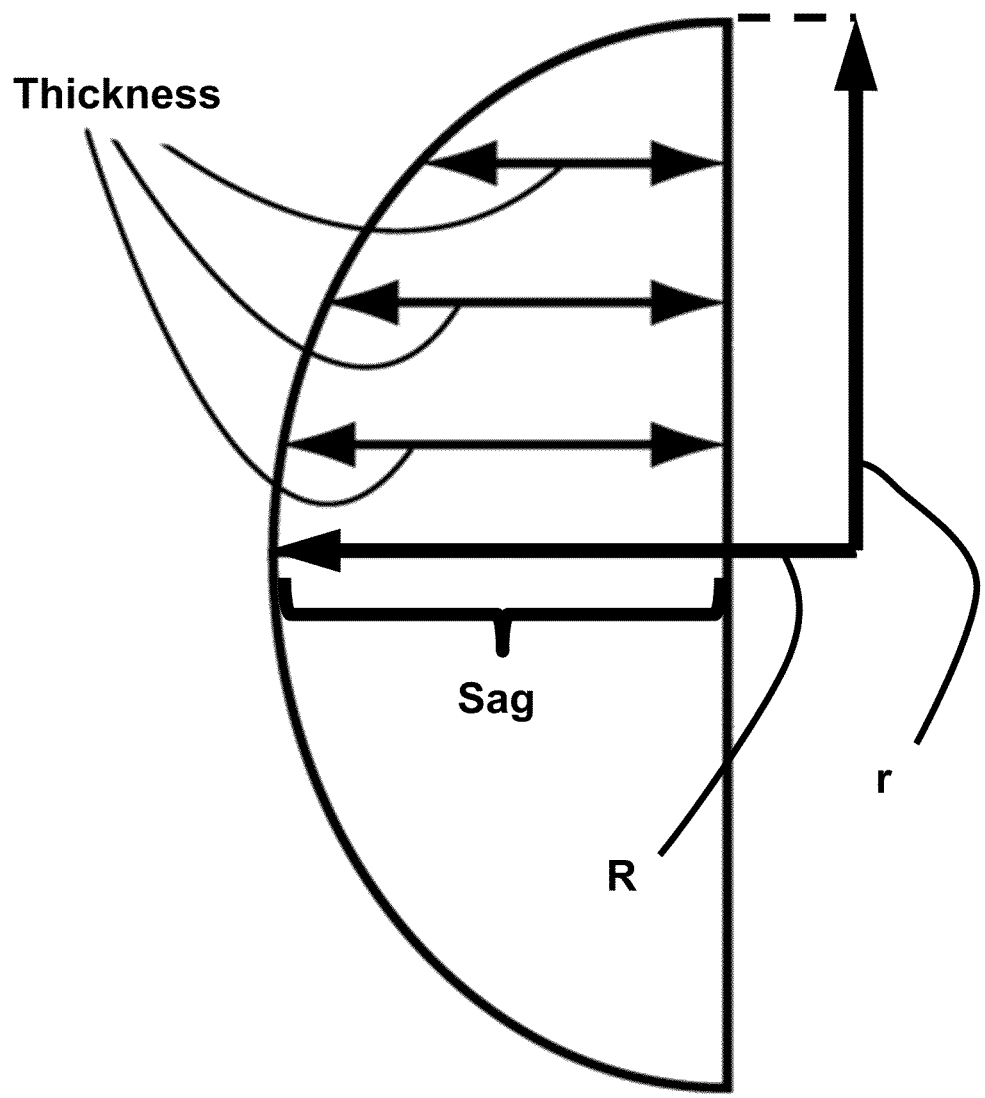
FIG. 8 is a schematic view depicting some dimensions of high sag thick lenses.

FIG. 8 is a schematic view depicting some dimensions of high sag thick lenses. The sag of the lens shown in FIG. 8 can be defined as:

$$Sag = R - \sqrt{R^2 - r^2}$$

where:
R is the radius of curvature of the second optical active surface 18; and
r is the radius of the lens 12 perpendicular to the optical axis.

Figure 9:
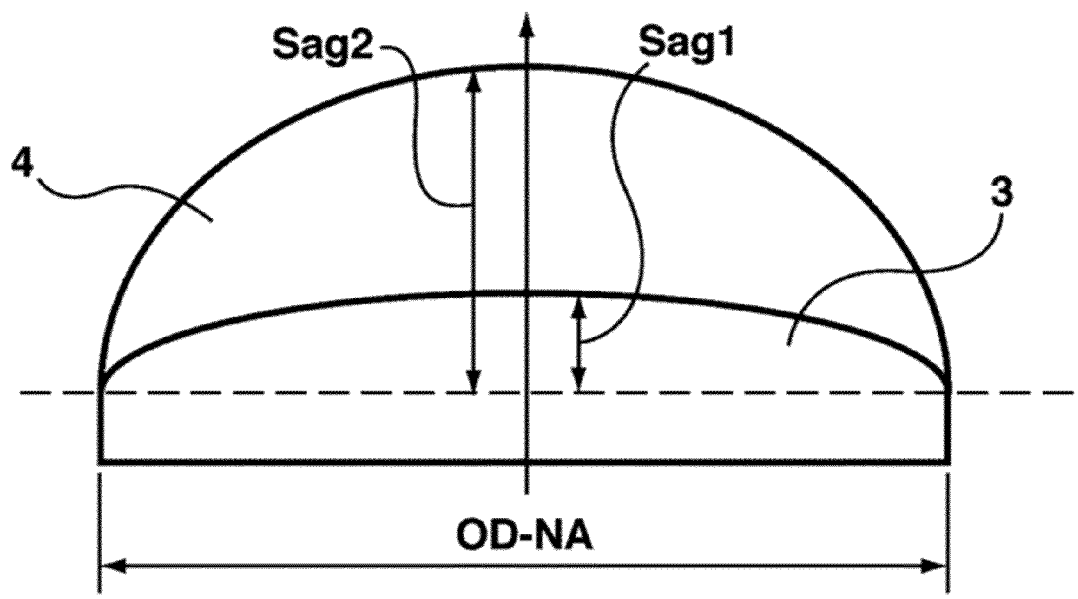
FIG. 9 is a schematic view illustrating the differences between the top portion of two lenses, one having a low sag and one having a high sag.

FIG. 9 is a schematic view illustrating the differences between the top portion of two optical lenses, one having a low sag and one having a higher sag. Lens 3 is a low sag lens and lens 4 is a high sag lens. The lenses 3, 4 are defined by an outer diameter OD that is equivalent to the numerical aperture NA of the lenses 3, 4.

Figures 10, 11:
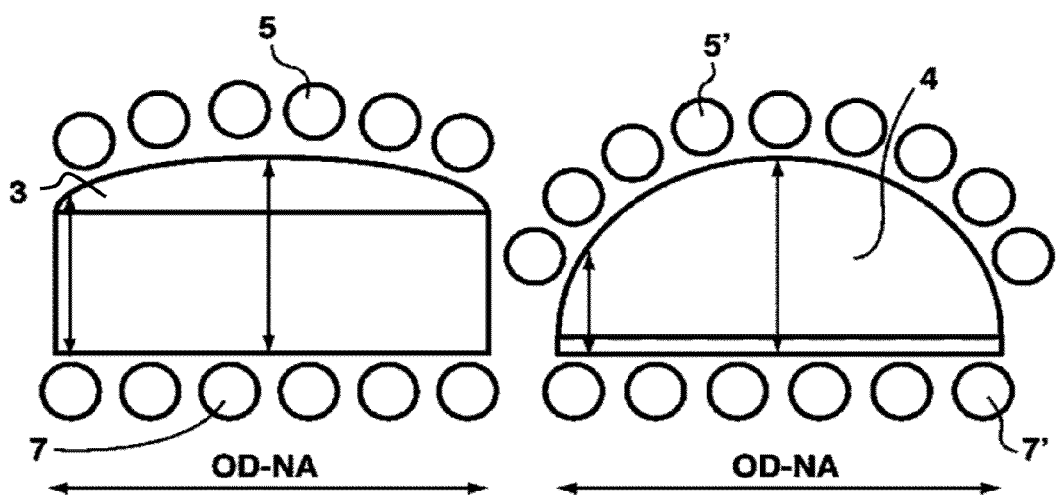
FIGS. 10 and 11 are schematic views showing the two lenses in FIG. 9 during manufacturing and the cooling channels of the corresponding mold cavities.

FIGS. 10 and 11 are schematic views showing the two lenses 3, 4 in FIG. 9 during manufacturing and the cooling channels of the corresponding mold cavities.

The low sag lens 3 shown in FIG. 10 is surrounded by upper cooling channels 5 and lower cooling channels 7. The distance between the upper and lower cooling channels 5, 7 is quite constant across the low sag lens 3. This facilitates cooling the lens 3 during manufacturing since its thickness from the center to the edges is relatively uniform.

The high sag lens 4 shown in FIG. 11 has a relatively steep change in thickness from the center to the edges. This makes the distance between upper and lower cooling channels 5', 7' of this lens 4 less evenly spaced than the cooling channels 5, 7 of the low sag lens 3. Molding this high lens 4 is a single step makes cooling harder to control and predict. The thinner plastic material at the edges of the lens 4 will cool faster than the thicker plastic material at the middle of the lens 4, thereby making the cooling of the lens 3 almost unpredictable and creating distortions that can impacts the quality of the optical active surfaces.

FIGS. 12 to 20 illustrate examples of injection molding equipment to manufacture a high sag thick lens according to an embodiment of this invention.

Figure 12:
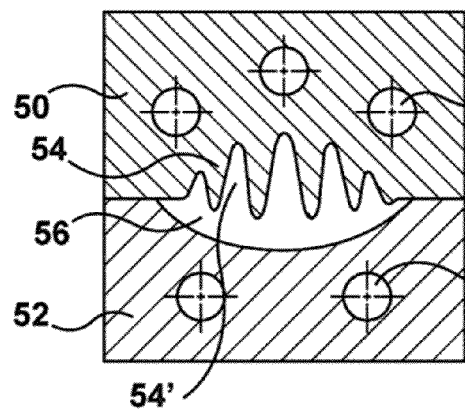

FIG. 12 is a cross-sectional view of a first mold insert 50 and of a corresponding mold core 52. A first cavity 56 is provided between the mold insert 50 and the mold core 52 to receive the hot molten plastic resin material that will form the first lens part 14 during the first injection shot.

Figure 13:
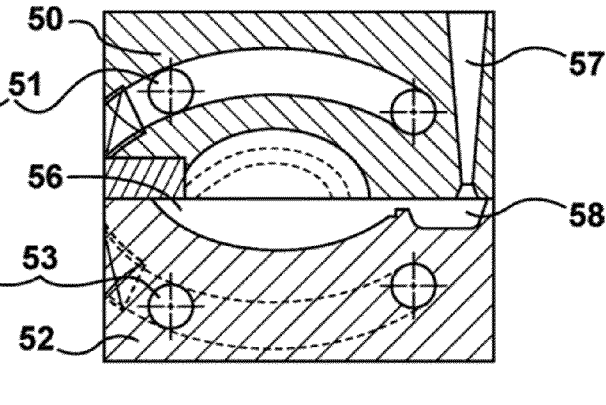

FIG. 13 is a cross-sectional view of the same mold insert 50 and the same mold core 52, as viewed 90° apart from what is shown in FIG. 12. The molten plastic material is injected through a runner channel 57 and then through a first mold cavity gate 58. The mold insert 50 includes a plurality of undercuts 54 that will create the baffles 14' on the first lens part 14 of the illustrated example.

The first mold insert 50 has a series of cooling channels 51 and the mold core 52 also has a series of cooling channels 53. Both cooling channels 51, 53 follow the shape of the optical active surfaces 18 and 13, respectively.

Figure 14:
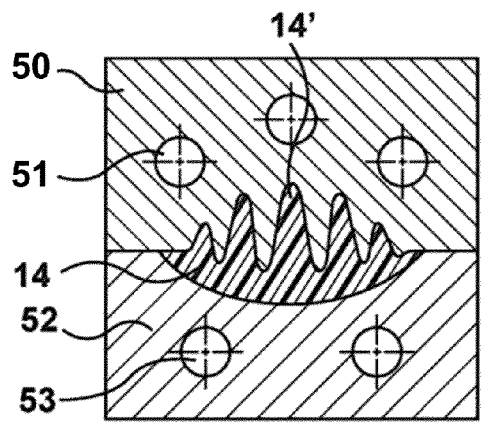

In the first mold cavity 56, the undercuts 54 are separated from one another by spacing portions 54' that create molding channels in the first mold cavity 56. The molding channels, thus the undercuts 54, are in alignment with the first mold cavity gate 58 to allow the hot molten plastic material to flow with no turbulence and in a direction that allows a full direct venting of the first mold cavity 56 as the molten plastic material is injected. The molten plastic material will fill the entire volume of the first mold cavity 56, as shown in FIG. 14.

After filling the first mold cavity 56 with molten plastic material, the first lens part 14 is cooled within the first mold cavity 56 with the first mold insert 50 and the mold core 52 remaining in a closed position. The undercuts 54 provide an increased surface area that promotes the heat transfer between the first lens part 14 and the cooling channels 51. This shortens the cooling time.

After cooling, the same mold core 52 and the first lens part 14 that was just formed thereon will be used to make the second lens part 17. A second mold insert 55 is provided to create a second mold cavity 64, as shown in FIGS. 15 and 16. The baffles 14' of the first lens part 14 are aligned with respect to a second mold cavity gate 61 in a manner that allows a second shot of molten plastic material to flow and fill the second mold cavity 64 following a mold filling path along the side surfaces of the baffles 14'.

Figure 18:
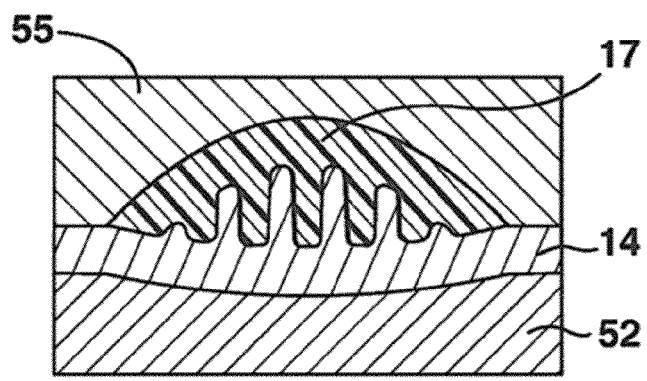

When the second shot of hot molten plastic material is injected, the elongated baffles 17' being created with the rest of the second lens part 17 are fused with the baffles 14' due to the over-molding injection. The baffles 14' create channels that allow the removal of air and gas from the second mold cavity 64, as shown in FIG. 17. As can be seen, the melt stream 6 advances between the baffles 14' in the spacing 14" and creates a series of streams 3'. Because the flow between the baffles 14" has no obstacles, the molten plastic material flows without any turbulence and the second cavity mold 64 is filled with a proper venting facilitated by the alignment of the baffles 14' with respect to the second mold gate 61. This prevents bubbles from being formed in the second lens part 17 and in-between the two lens parts 14, 17, thereby significantly improving the quality of the lens 12. The molten plastic material will fill the entire volume of the second mold cavity 64, as shown in FIG. 18.

Figure 19:
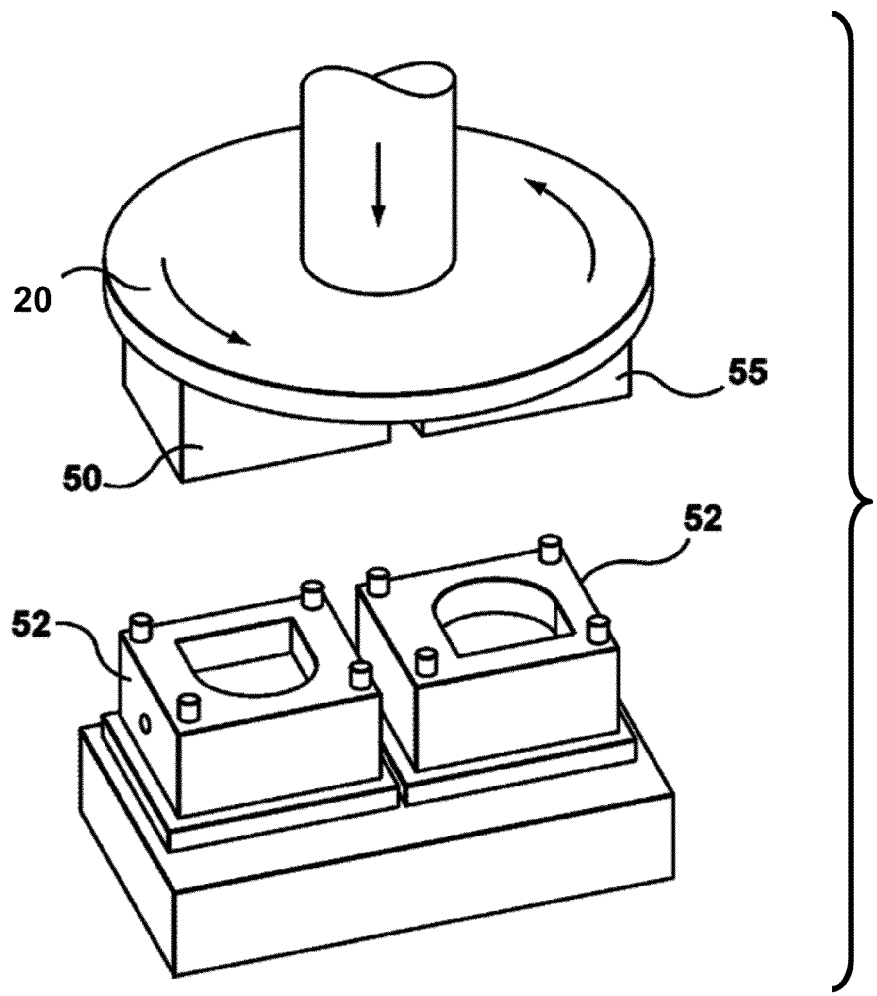

FIG. 19 is a semi-schematic isometric view showing an example of a rotary mold provided to manufacture a high sag thick lens according to an embodiment of this invention. This rotary mold includes a first mold insert 50, a second mold insert 55 and two corresponding mold cores 52. The first mold insert 50 and the second mold insert 55 are provided under a rotary plate 20 that can be repositioned after each manufacturing step. The rotary plate 20 can be lifted, pivoted of 180° and lowered again onto the mold cores 52. The various parts are thus configured and disposed accordingly.

Figure 20:
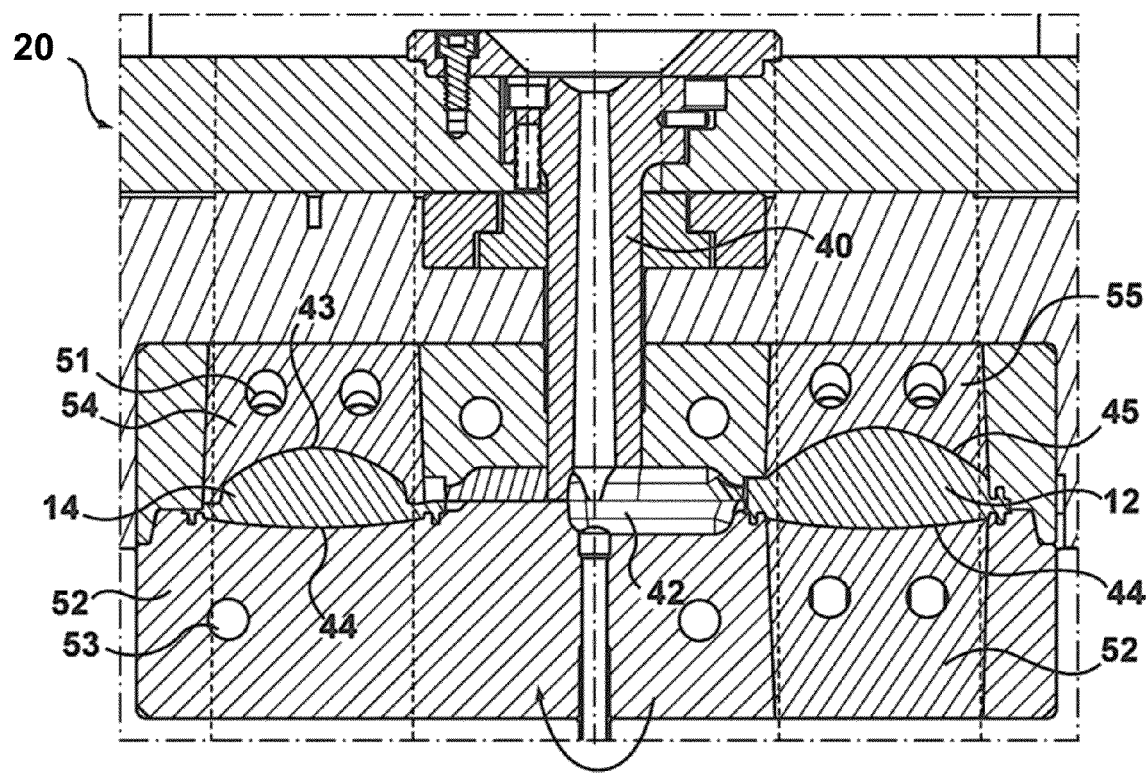

FIG. 20 is a cross-sectional view of an example of an injection molding equipment based on the principles shown in FIG. 19. It includes a nozzle 40 injecting the molten plastic material into the two mold cavities. The first mold cavity forms the first lens part 14 between mold surfaces 43 and 44. After the first injection shot, the rotary plate 20 is moved into a second position to form the second lens part 17 between the first lens part 14 and the mold surface 45 of the second mold insert 55. Variants are possible as well.

As can be appreciated, the lens design of this invention facilitates the molding process so that the first lens part 14 and the second lens part 17 have thinner surfaces than the high sag thick lens 12 and these surfaces have an equal or a comparable thickness T.

Figure 21:
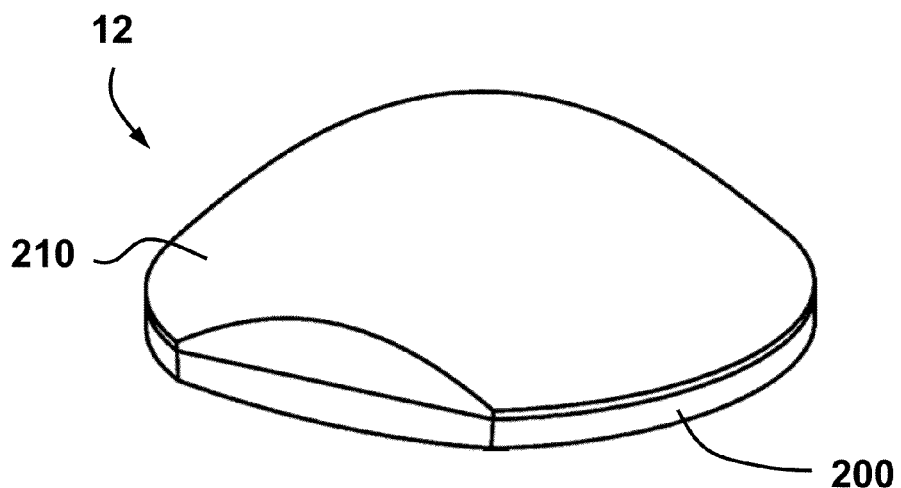
FIGS. 21 to 26 illustrate another example of a high sag thick lens according to an embodiment of this invention.
Figure 22:
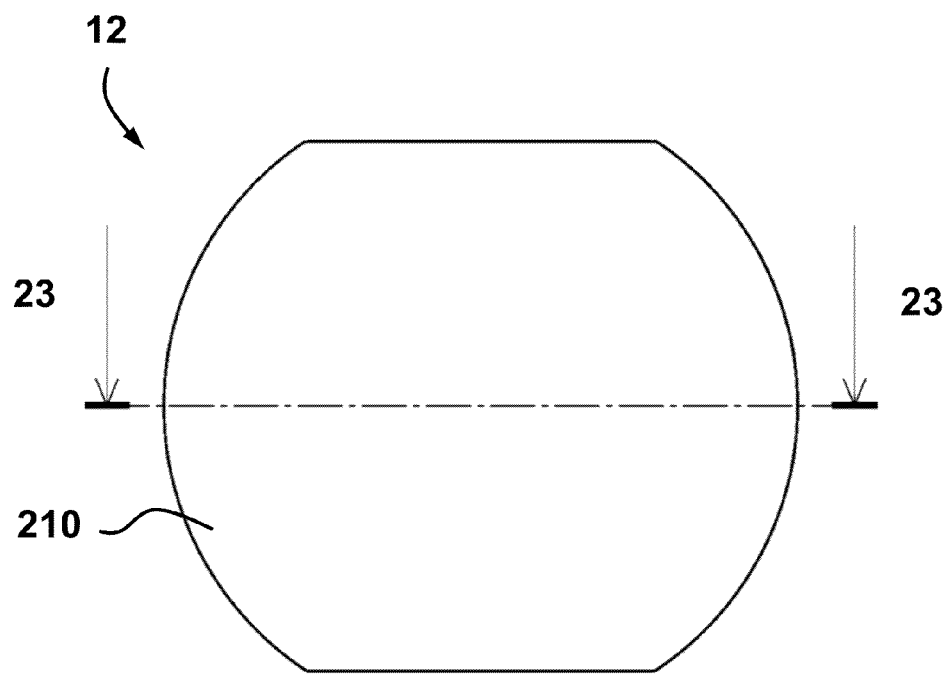
Figure 23:
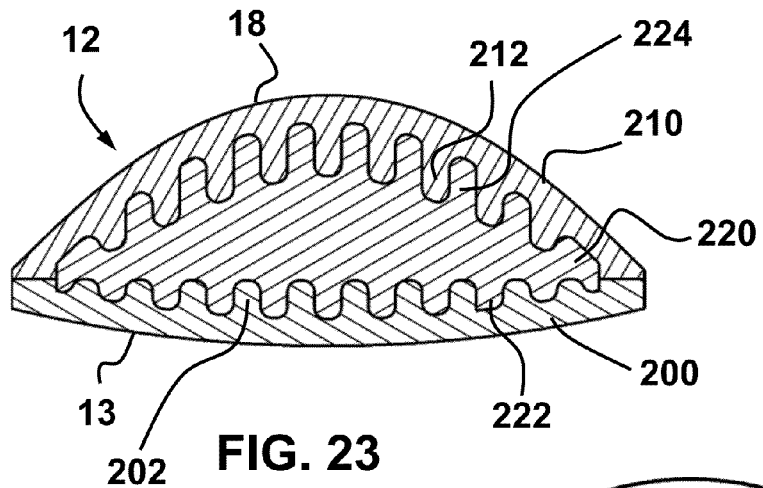
Figure 24:
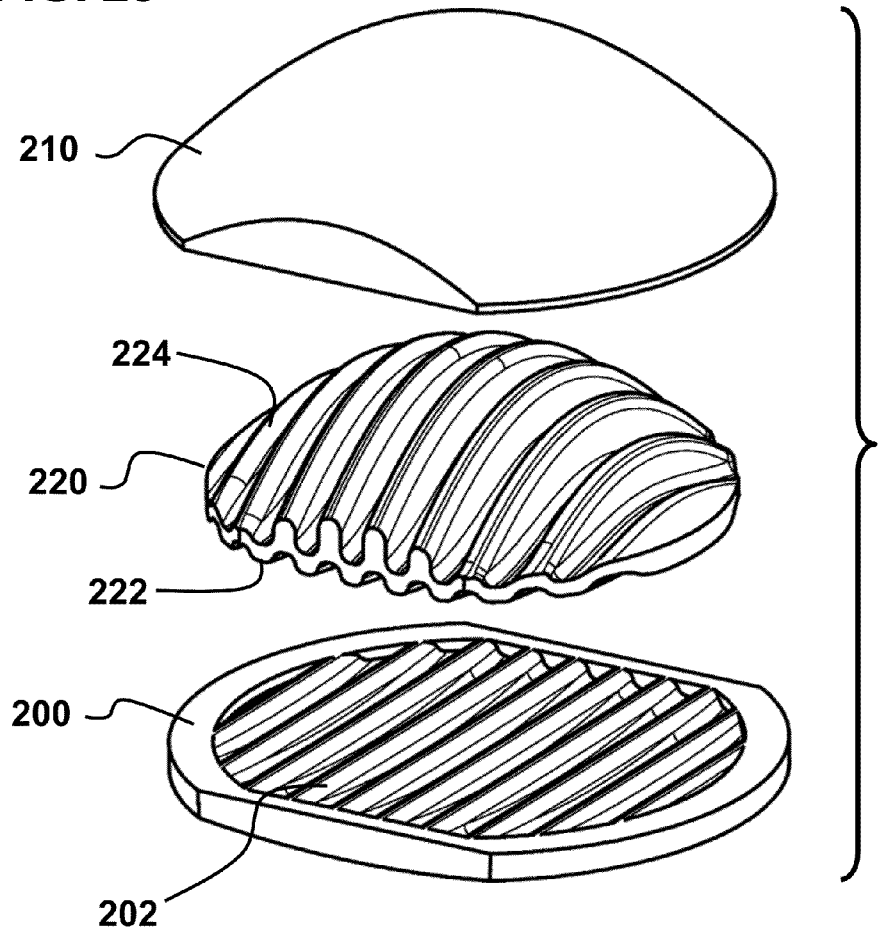
Figure 25:
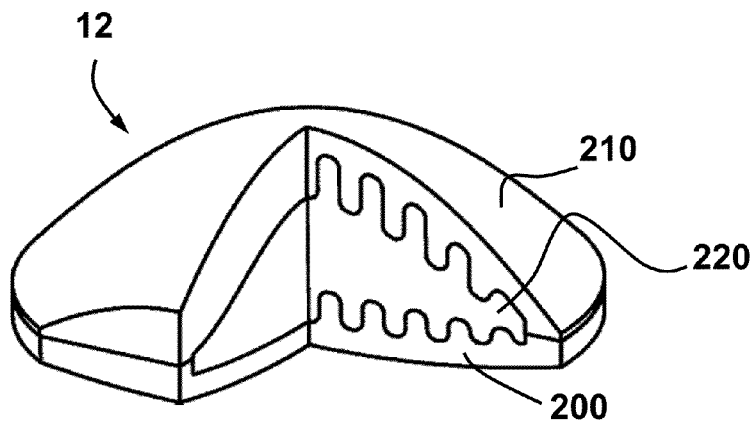
Figure 26:
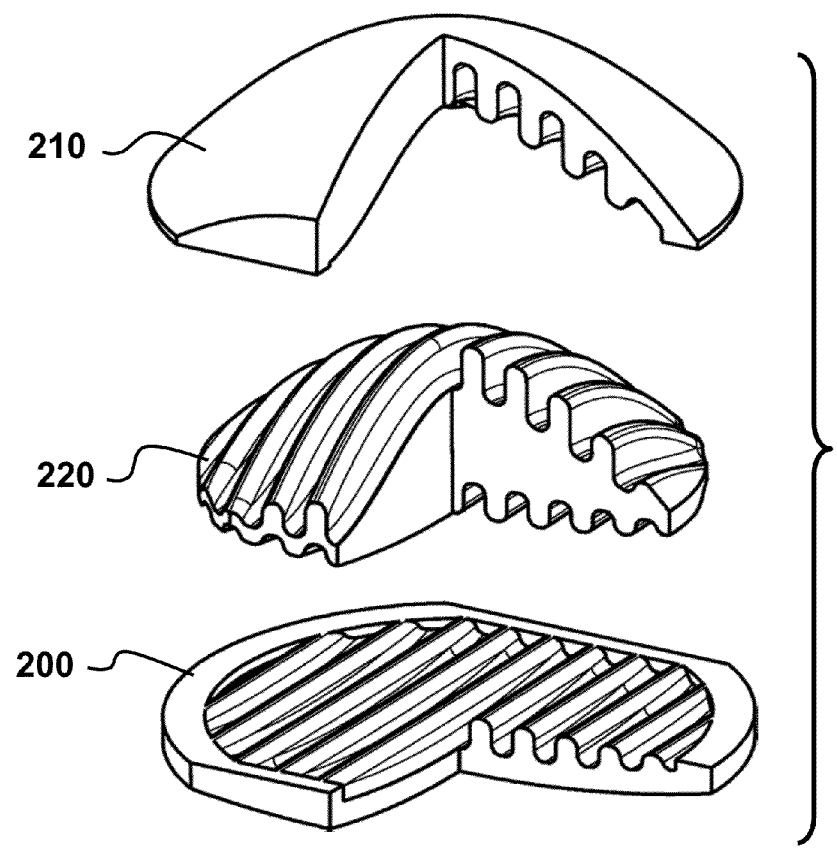

FIGS. 21 to 26 illustrate another example of a high sag thick lens 12 according to an embodiment of this invention. FIG. 21 is an isometric view of this lens 12 and FIG. 22 is a top view thereof. FIG. 23 is a cross-sectional view of the lens 12 taken along line 23-23 in FIG. 22. FIG. 24 is an isometric view showing the various parts of the lens 12 of FIG. 21 being separated from one another for the purpose of illustration. FIG. 25 is an isometric and partially cut-away view of the lens 12 of FIG. 21. FIG. 26 is an isometric view showing the various parts of the lens 12 as illustrated in FIG. 25 being separated from one another for the purpose of illustration.

FIGS. 21 to 26 show that the lens 12 includes three lens parts, namely a first outer lens part 200, a second outer lens part 210 and a lens core part 220. The lens core part 220 is completely embedded between the first outer lens part 200 and the second outer lens part 210. This configuration greatly improves the quality of high sag thick lenses having a relatively high sag, for instance a sag as high as 40 mm. The first outer lens part 200, the second outer lens part 210 and the lens core part 220 have a same refractive index and are made of a single solidified injection-moldable plastic material. The plastic material entirely fills the interior of the lens 12 in a gapless manner to prevent refraction of the incoming light rays from the light source by any one of elongated baffles inside the body of the lens 12. The light source can be for instance the light source 9 in FIG. 1. Variants are possible as well.

The first outer lens part 200 has opposite first and second surfaces. The first surface of the first outer lens part 200 defines the first curved optical active surface 13 of the lens 12 that refracts incoming light rays from the light source. The first curved optical active surface 13 is one of the external surfaces of the body of the lens 12. The second surface of the first outer lens part 200 includes a plurality of first elongated baffles 202. The second surface is embedded inside the lens 12.

The second outer lens part 210 also has opposite first and second surfaces. The first surface of the second outer lens part 210 defines the second optical active surface 18 of the lens 12 that refracts the incoming light rays from the light source. The second curved optical active surface 18 is one of the external surfaces of the body of the lens 12. The second surface of the second outer lens part 210 includes a plurality of second elongated baffles 212. The second surface is embedded inside the lens 12.

The lens core part 220 has opposite first and second surfaces. The first surface of the lens core part 220 includes a plurality of third elongated baffles 222 and the second surface of the lens core part 220 includes a plurality of fourth elongated baffles 224. The first and second surfaces are embedded inside the lens 12.

During manufacturing, the lens core part 220 is first formed inside a corresponding mold cavity. The lens core part 220 does not need to be very accurate in terms of its dimensions since it will be completed embedded inside the lens 12 at the end of the manufacturing process. Thus, the lens core part 220 can be made thicker in the middle. The baffles on both sides of the lens core part 220 improve the heat transfer with the mold during its manufacturing.

Once the lens core part 220 is formed, the first outer lens part 200 is formed directly over one side of the lens core part 220. The second surface of the first outer lens part 200 and the first surface of the lens core part 220 are then fused together, with the first elongated baffles 202 being intertwined with the third elongated baffles 222. Then, the second outer lens part 210 is formed over the opposite side of the lens core part 220. The second surface of the second outer lens part 210 and the second surface of the lens core part 220 are fused together, with the second elongated baffles 212 being intertwined with the fourth elongated baffles 224.

As can be seen, the various baffles inside this lens 12 are all in the same direction. Variants are also possible.

Figure 27:
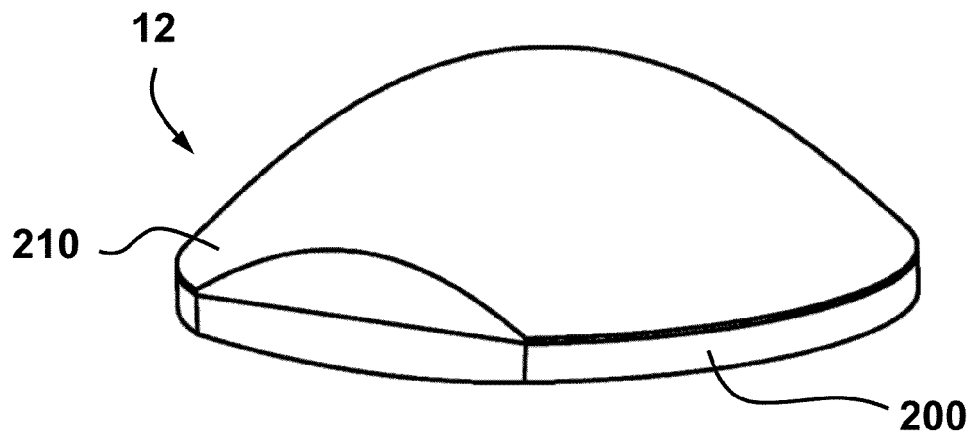
FIGS. 27 to 32 illustrate another example of a high sag thick lens according to an embodiment of this invention.
Figure 28:
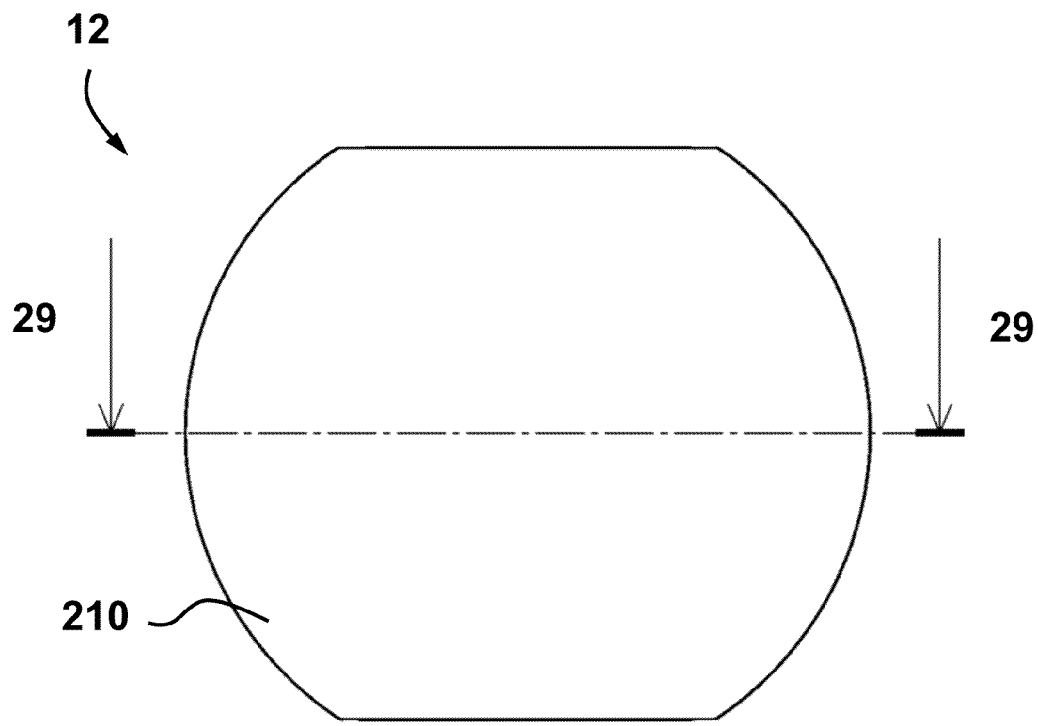

FIGS. 27 to 32 illustrate another example of a high sag thick lens 12 according to an embodiment of this invention. FIG. 27 is an isometric view of this lens 12 and FIG. 28 is a top view thereof.

Figure 29:
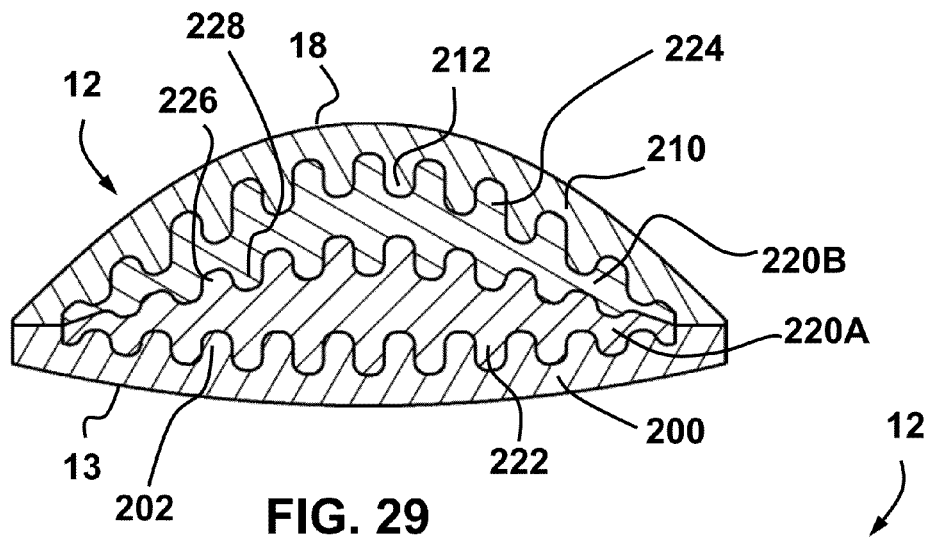
Figure 30:
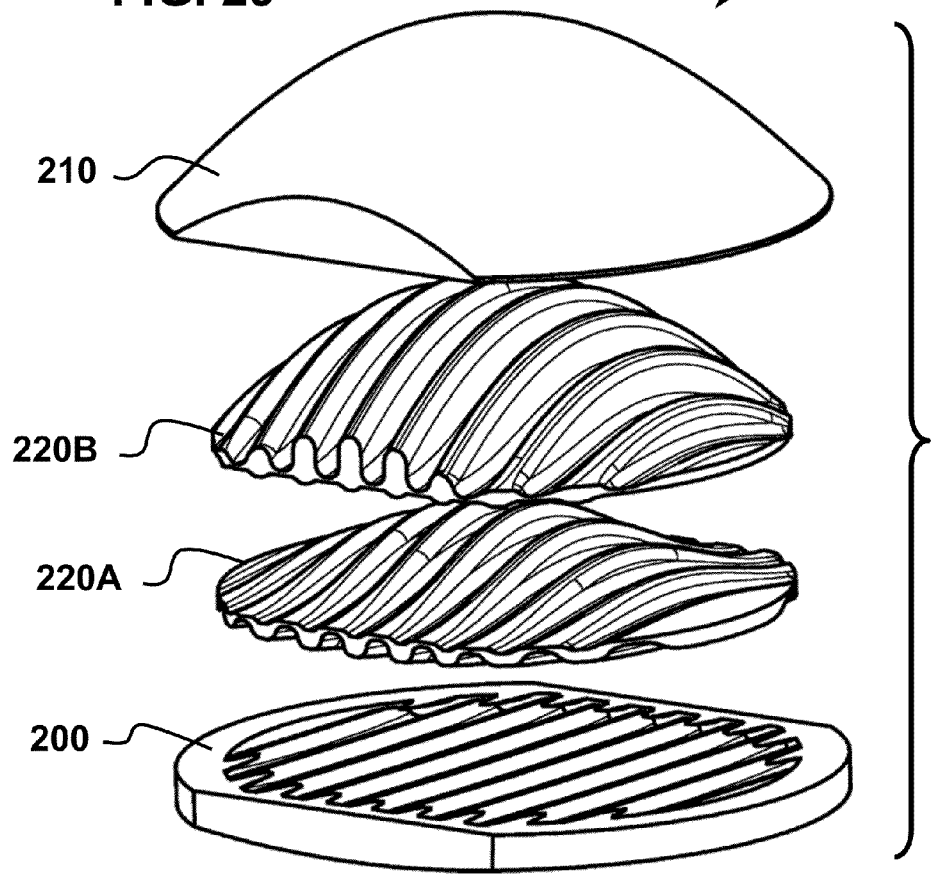
Figure 31:
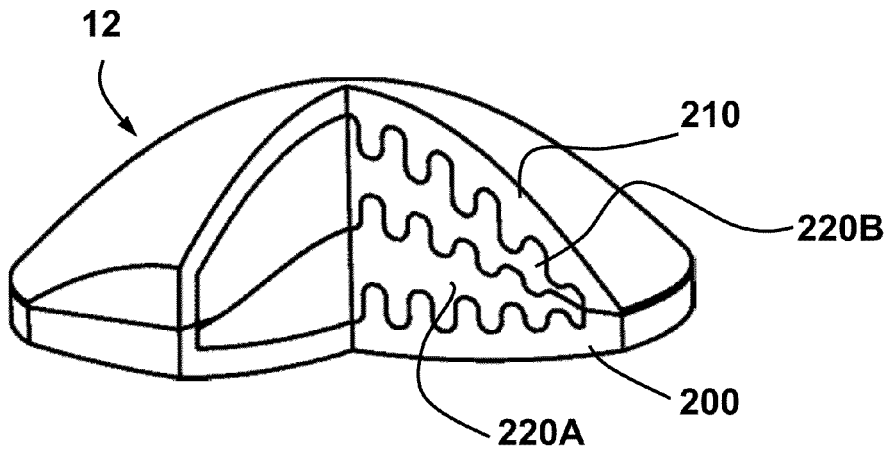
Figure 32:
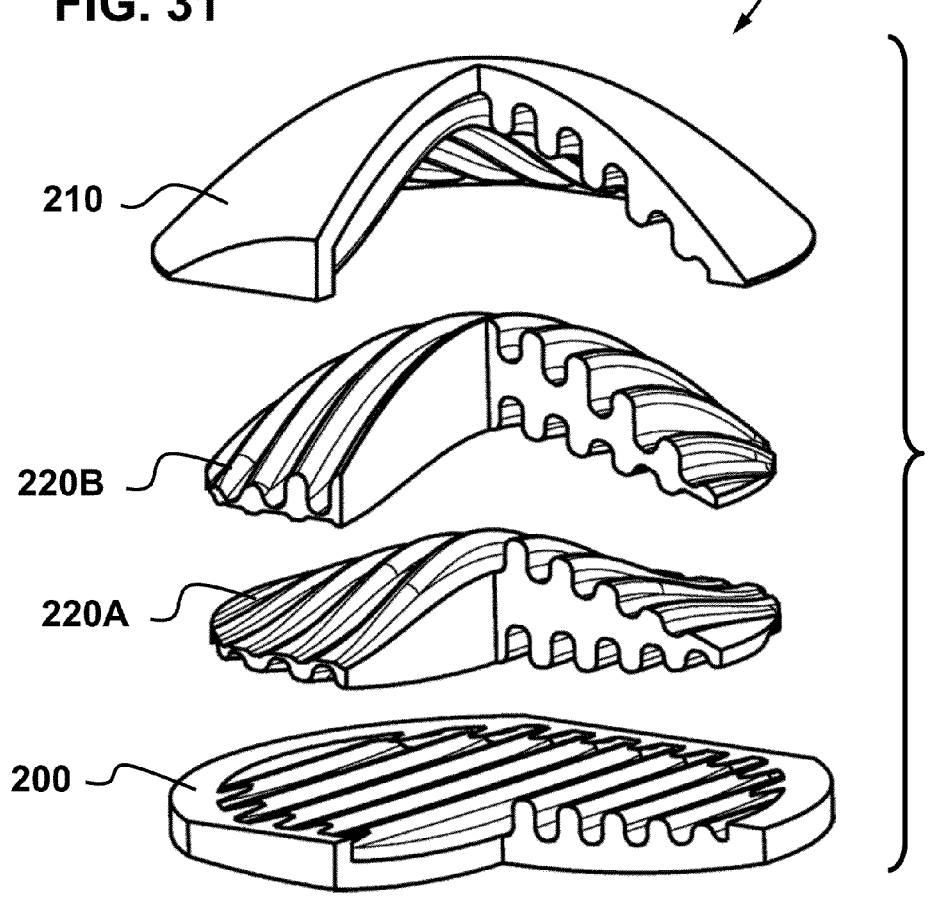

FIG. 29 is a cross-sectional view of the lens 12 taken along line 29-29 in FIG. 28. FIG. 30 is an isometric view showing the various parts of the lens 12 of FIG. 27 being separated from one another for the purpose of illustration. FIG. 31 is an isometric and partially cut-away view of lens 12 of FIG. 27. FIG. 32 is an isometric view showing the various parts of the lens 12 as illustrated in FIG. 31 being separated from one another for the purpose of illustration.

FIGS. 27 to 32 show that this lens 12 has a configuration similar to the lens 12 in FIGS. 21 to 26. However, the lens core part 220 is made of two subsections 220A, 220B that are over molded. Each subsection 220A, 220B has intertwined baffles 226, 228. Using more than two subsections is also possible. In this example, the subsection 220A on the bottom of the views was made first.

As can be seen, the various baffles inside this lens 12 are all in the same direction. Variants are also possible.

Figure 33:
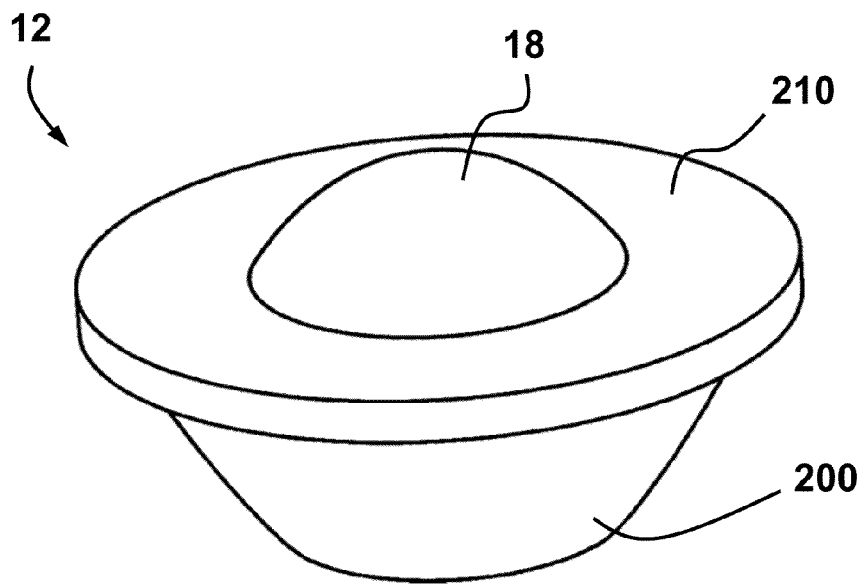
FIGS. 33 to 44 illustrate another example of a high sag thick lens according to an embodiment of this invention.
Figure 34:
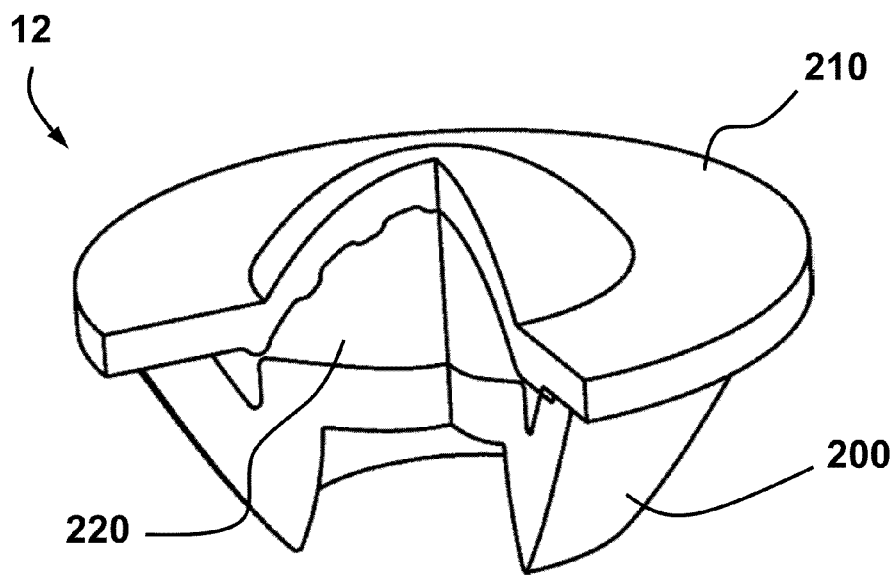
Figure 35:
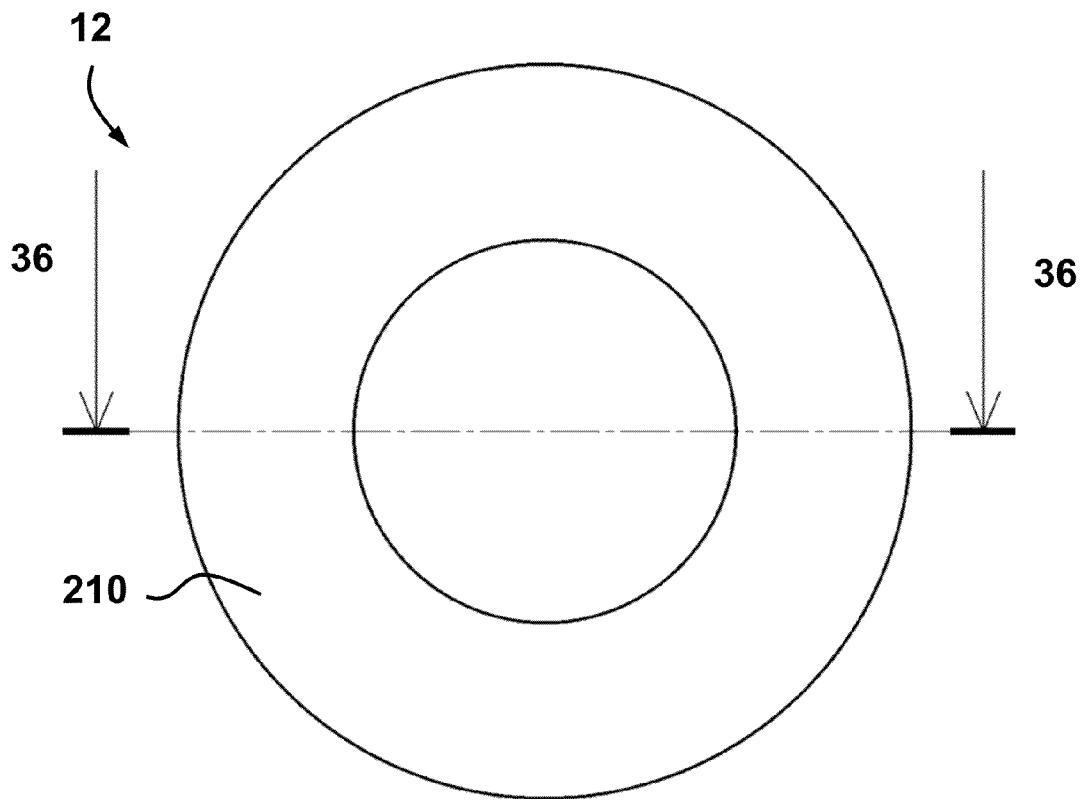
Figure 36:
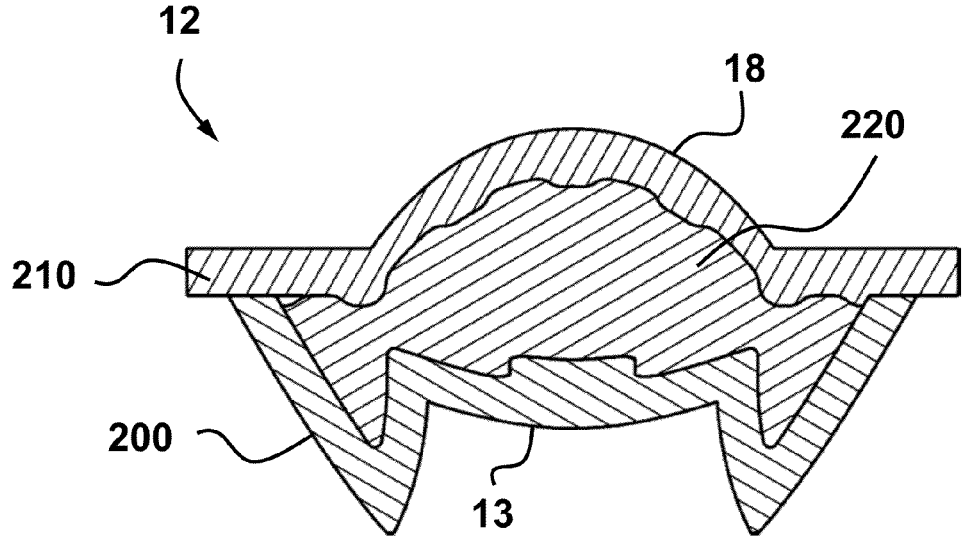
Figure 37:
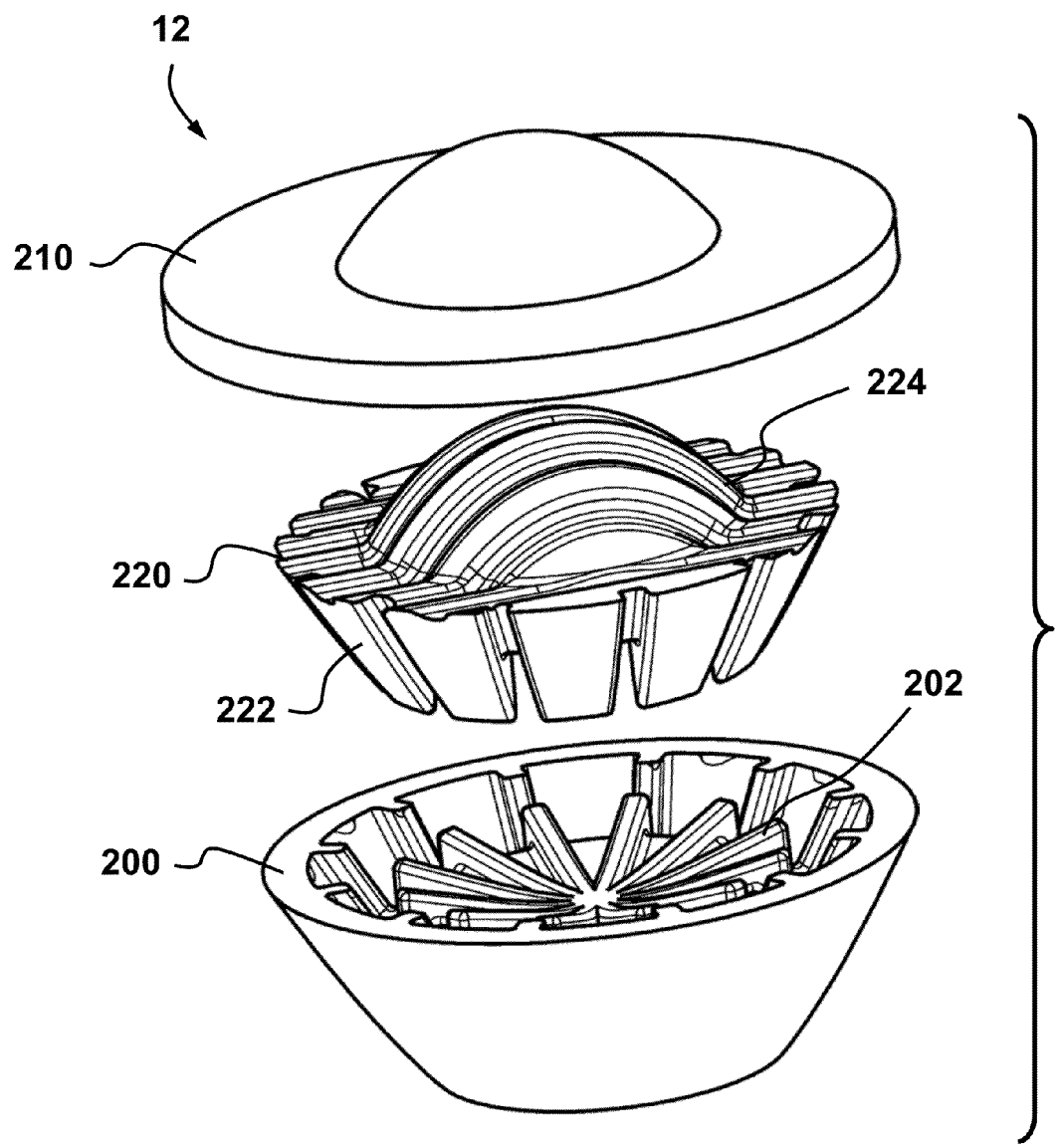
Figure 38:
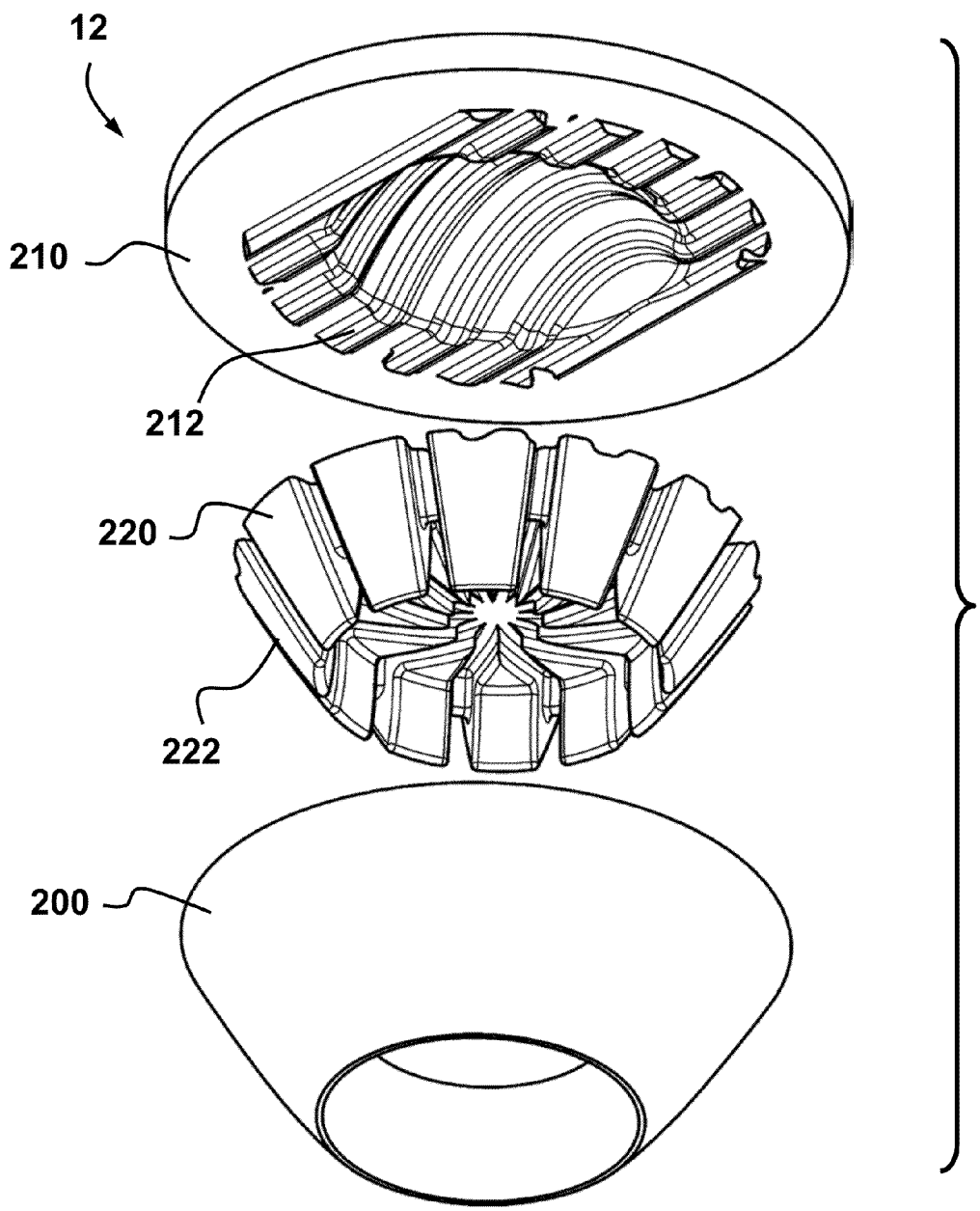
Figure 39:
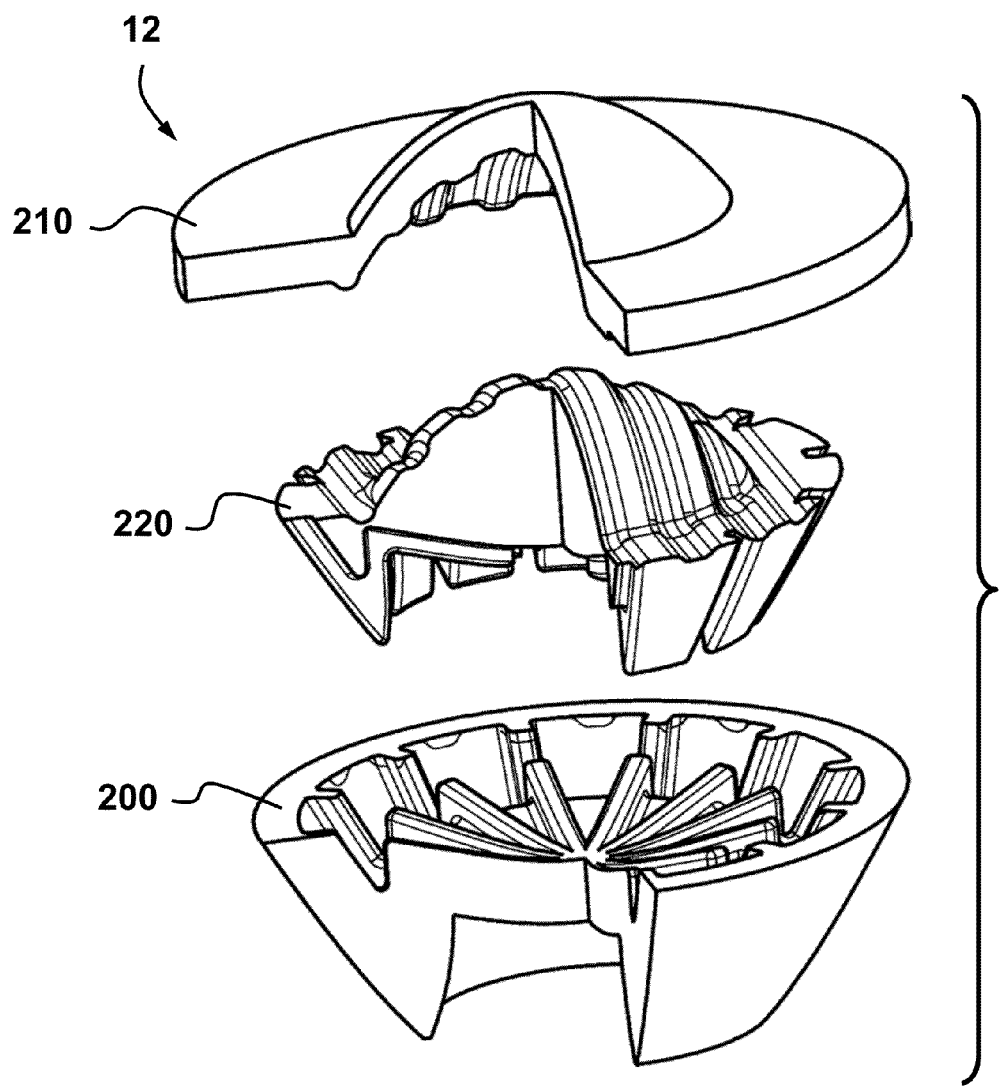

FIGS. 33 to 44 illustrate another example of a high sag thick lens 12 according to an embodiment of this invention. FIG. 33 is an isometric view of this lens 12 and FIG. 34 is an isometric and partially cut-away view of lens 12 of FIG. 33. FIG. 35 is a top view of the lens 12 and FIG. 36 is a cross-sectional view of the lens 12 taken along line 36-36 in FIG. 35. FIGS. 37 and 38 are isometric views showing the various parts of the lens 12 as illustrated in FIG. 33 being separated from one another for the purpose of illustration. FIG. 39 is an isometric view showing the various parts of the lens 12 as illustrated in FIG. 34 being separated from one another for the purpose of illustration.

Figure 40:
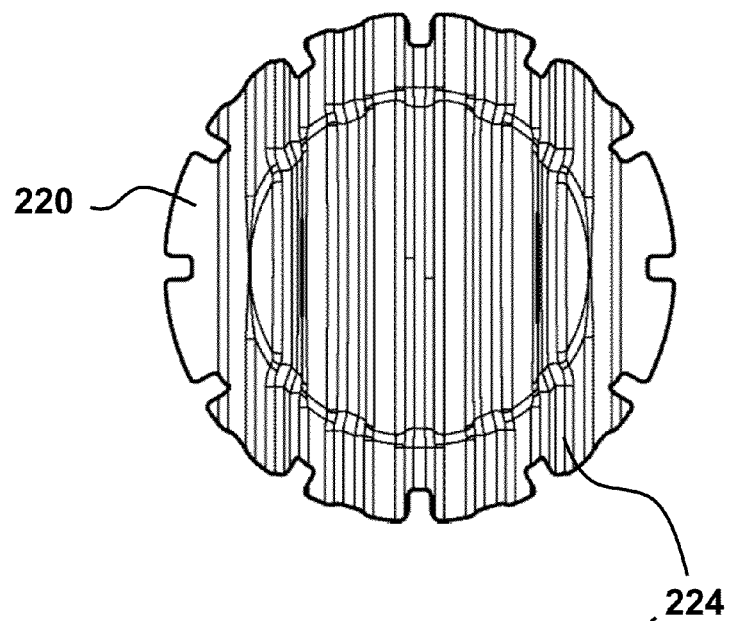
Figure 41:
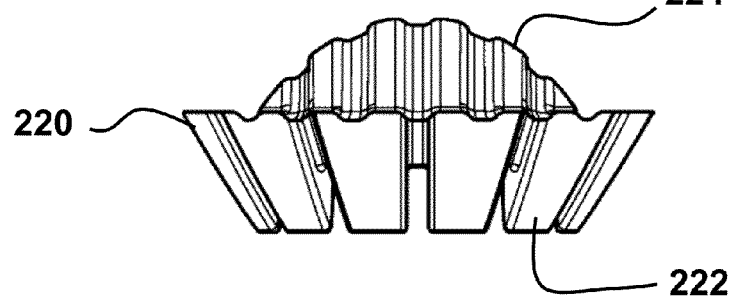
Figure 42:
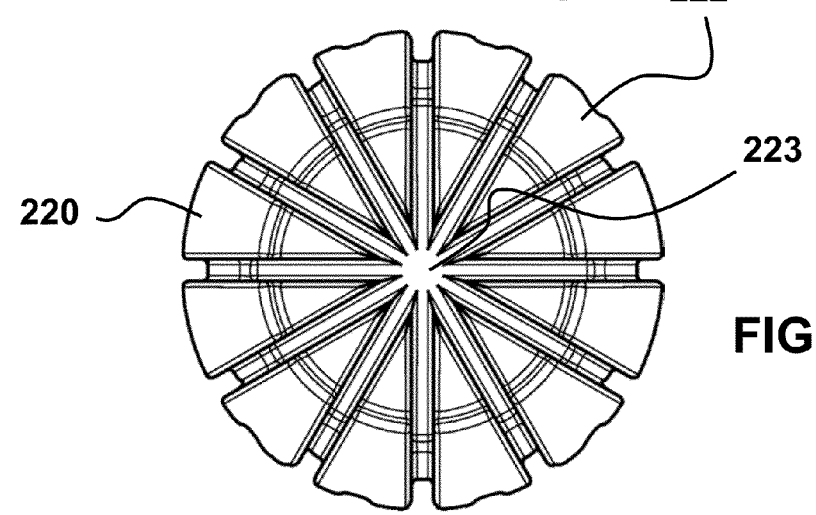
Figure 43:
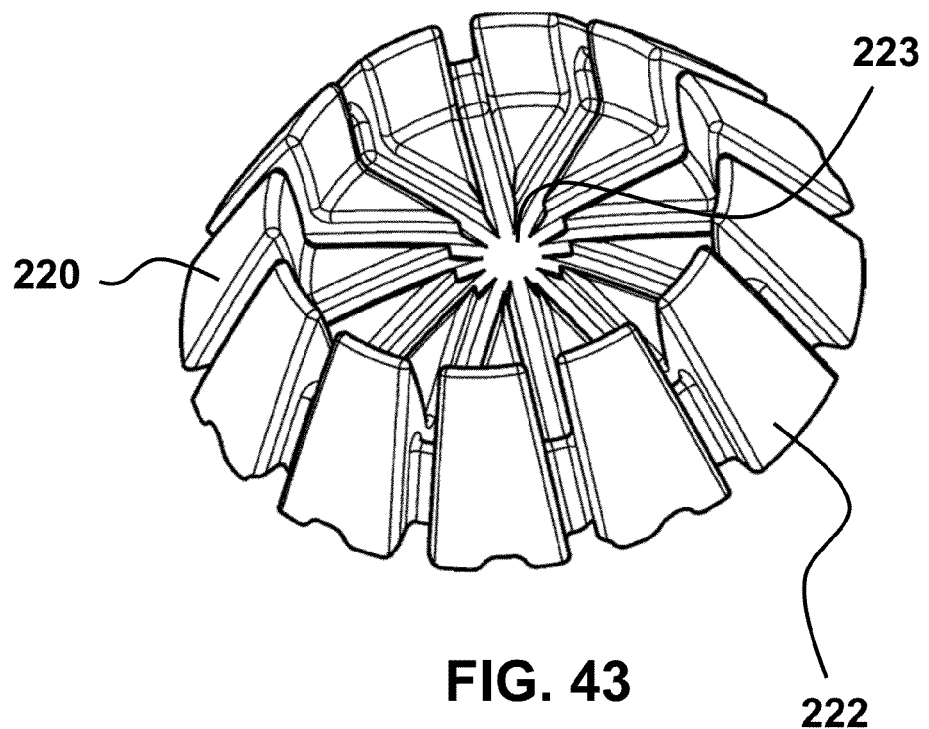
Figure 44:
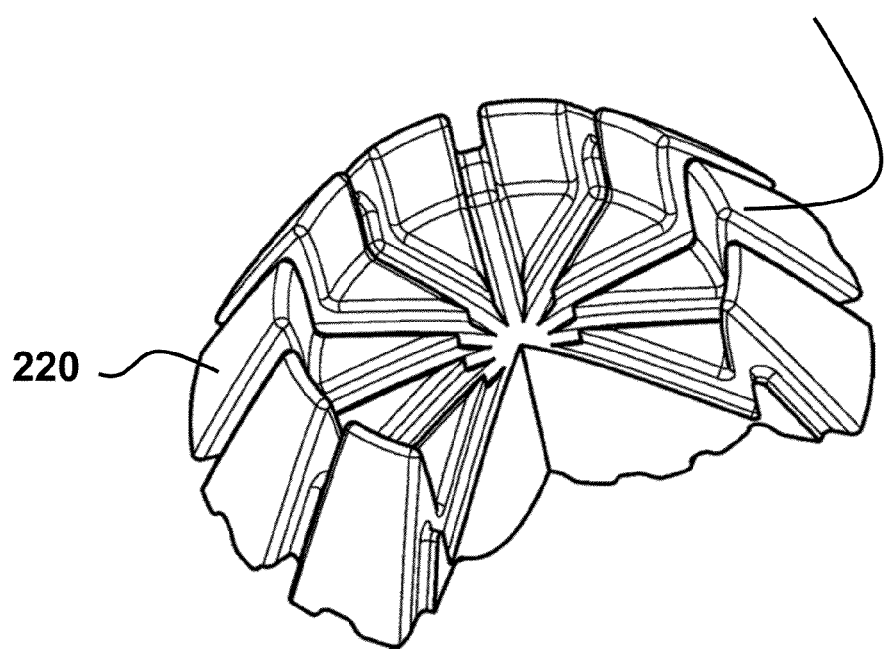

FIGS. 40 to 44 show the core lens part 220 of the lens 12 of FIGS. 33 to 39. FIG. 40 is a top view there, FIG. 41 is a side view thereof, FIG. 42 is a bottom view thereof, FIG. 43 is an isometric top view thereof, and FIG. 44 is a view similar to FIG. 43 but with a partial cut-away portion.

The shape of the lens 12 in FIGS. 33 to 44 is more complex than the shapes of the lenses 12 is the previous examples. The lens core part 220 for this lens 12 includes radially-disposed elongated baffles 222 on the side facing the first outer lens part 200. This side is the bottom side in the illustrated example. The baffles 222 are somewhat triangular near the center 223 and become larger towards the outer edge. The outer portion of the baffles 222 is also thicker at the outer edge. The lens core part 220 is thus a rough sketch over which the highly-precise optical active surfaces 13, 18 will be formed using the two outer lens parts 200, 210.

When make the first outer lens part 200 of this lens 12, the hot molten plastic material is injected at the center of the mold cavity. The melt flows radially between the radially-disposed elongated baffles 222 of the lens core part 220 from the center 223. The opposite side of the lens core part 220 of the illustrated lens 12 includes baffles 224 that are parallel to one another.

The embodiments of this invention are applicable to illumination apparatuses in many applications, including for automotive vehicles. Illumination apparatuses for automotive vehicles include for instance head lights and fog lights, to name just a few. The high sag thick lenses can be used as low beam lenses, high beam lenses and fog light lenses. The following examples illustrate some of the dimensions required for a high sag thick lens according to this invention. These dimensions are informative and lenses smaller or bigger can be also designed of manufactured according to the teachings of this invention. In the following examples, the values are in millimeters. L is the length of the lens 12 and W is the width of the lens, since they are not circular. In other embodiments, the length L can be regarded as the sole diameter of a circular lens, in other embodiments the width W can be regarded as the sole diameter of a circular lens and the values shown before are also applicable for such round or circular lenses.

Low/High Beam Lenses:
Example 1: L100×W60×Thickness (max 30 mm–min 4 mm), thickness ratio: 7.5:1 and Sag: 26 mm
Example 2: L135×W40×Thickness (max 18.5 mm–min 1 mm), thickness ratio: 18.5:1 and Sag: 18 mm For circular/round lenses the diameters are in the range of L and W shown above and the corresponding thicknesses, sag values and thickness ratios:
Front Fog Lenses:
Example 3: L50×W30×Thickness (max 12 mm–min 2 mm), thickness ratio: 6:1 and Sag: 10 mm
Example 4: L45×W40×Thickness (max 13 mm–min 2 mm), thickness ratio: 6.5:1 and Sag: 11 mm The present detailed description and the appended figures are meant to be exemplary only. A skilled person will recognize that variants can be made in light of a review of the present disclosure without departing from the proposed concept. It should be noted that the word "wherein" used in the present text in not limitative.

What is claimed is:

1. A high sag thick lens for use with an illumination apparatus having a light source, the lens including:
    a first outer lens part having opposite first and second surfaces, the first surface of the first outer lens part defining a first curved optical active surface of the lens that refracts incoming light rays from the light source, the second surface of the first outer lens part including a plurality of first elongated baffles;
    a second outer lens part having opposite first and second surfaces, the first surface of the second outer lens part defining a second optical active surface of the lens that refracts the incoming light rays from the light source, the second surface of the second outer lens part including a plurality of second elongated baffles; and
    a lens core part forming an interior of the lens and that is embedded between the first outer lens part and the second outer lens part, the lens core part having opposite first and second surfaces, the first surface of the lens core part including a plurality of third elongated baffles and the second surface of the lens core part including a plurality of fourth elongated baffles;
    where the second surface of the first outer lens part and the first surface of the lens core part are fused together with the first elongated baffles being intertwined with the third elongated baffles, and where the second surface of the second outer lens part and the second surface of the lens core part are fused together with the second elongated baffles being intertwined with the fourth elongated baffles, and where the first outer lens part, the second outer lens part and the lens core part have a same refractive index and are made of a single solidified injection-moldable plastic material that entirely fills the interior of the lens in a gapless manner to prevent refraction of the incoming light rays from the light source by any one of the elongated baffles inside the lens.

2. The lens as defined in claim 1, wherein the first elongated baffles and the second elongated baffles are parallel to one another.

3. The lens as defined in claim 1, wherein the first elongated baffles and the third elongated baffles are extending substantially radially inside the lens.

4. The lens as defined in claim 1, wherein the lens core part is made of two over molded subsections, the subsections having intertwined baffles between them.

5. A high sag thick lens made by injection molding in a mold through the injection of a single molten plastic material in at least three injection shots using a multi-step process, the lens including:
    a first optical active surface having a first outer edge and a second optical active surface having a second outer edge;
    a lens body defined between the first optical active surface and the second optical active surface for light rays to enter the lens through the first optical active surface and exit the lens through the second optical active surface, the lens body including a lens core part embedded inside the lens body between a first and a second outer lens part, the first optical active surface being provided on the first outer lens part that is injection molded after the lens core part and the second optical active surface being provided on the second outer lens part that is injection molded after the first outer lens part;
    a first mold gate mark located at the first outer edge and a second mold gate mark located at the second outer edge;

- a first internal flow pattern including at least two spaced apart and continuous streams of solidified plastic material that fully extend across the lens body, on one side of the lens core part, from the first mold gate; and
- a second internal flow pattern including at least two spaced apart and continuous streams that extend across the lens body, on another side of the lens core part, from the second mold gate, the first and second internal flow patterns being visible using optical testing devices.

6. The lens as defined in claim 5, wherein the lens core part is made of two over molded subsections.

7. An illumination apparatus including:
- a solid state light source; and
- a high sag thick lens through which light from the solid state light source is collected, the lens being constructed as defined in any one of claims 1 to 6.

8. The illumination apparatus as defined in claim 7, wherein the solid state light source includes a LED.

9. The illumination apparatus as defined in claim 7 or 8, wherein the solid state light source and the high sag thick lens are provided inside an automotive head lamp.

* * * * *